(12) United States Patent
Richter et al.

(10) Patent No.: US 7,688,634 B2
(45) Date of Patent: Mar. 30, 2010

(54) METHOD OF OPERATING AN INTEGRATED CIRCUIT HAVING AT LEAST ONE MEMORY CELL

(75) Inventors: Detlev Richter, Munich (DE); Andreas Kux, Haar (DE)

(73) Assignee: Qimonda AG, Munich (DE)

( * ) Notice: Subject to any disclaimer, the term of this patent is extended or adjusted under 35 U.S.C. 154(b) by 68 days.

(21) Appl. No.: 11/834,612

(22) Filed: Aug. 6, 2007

(65) Prior Publication Data
US 2009/0040841 A1 Feb. 12, 2009

(51) Int. Cl.
G11C 11/34 (2006.01)
G11C 16/06 (2006.01)
G11C 16/04 (2006.01)
G11C 7/02 (2006.01)

(52) U.S. Cl. .............................. 365/185.2; 365/185.24; 365/210.1; 365/210.14

(58) Field of Classification Search .............. 365/185.2, 365/185.24, 210.1, 210.14
See application file for complete search history.

(56) References Cited

U.S. PATENT DOCUMENTS

| | | | |
|---|---|---|---|
| 5,172,338 A | 12/1992 | Mehrotra et al. | |
| 2004/0228198 A1* | 11/2004 | Shimizu | 365/232 |
| 2005/0270887 A1* | 12/2005 | Shimizu et al. | 365/232 |
| 2006/0072363 A1* | 4/2006 | Tran et al. | 365/207 |
| 2006/0109513 A1* | 5/2006 | Lee | 358/3.06 |
| 2006/0267076 A1* | 11/2006 | Sudo | 257/316 |
| 2006/0274576 A1 | 12/2006 | Redaelli et al. | |
| 2006/0274581 A1 | 12/2006 | Redaelli et al. | |
| 2006/0279996 A1 | 12/2006 | Yu et al. | |
| 2007/0171711 A1* | 7/2007 | Kang et al. | 365/185.03 |
| 2009/0027959 A1* | 1/2009 | Lee | 365/185.03 |

* cited by examiner

Primary Examiner—Ly D Pham

(57) ABSTRACT

Embodiments of the invention relate generally to a method for writing at least one memory cell of an integrated circuit; a method for writing at least two memory cells of an integrated circuit; and to integrated circuits. In an embodiment of the invention, a method for writing at least one memory cell of an integrated circuit is provided. The method includes determining a writing state of at least one reference memory cell, depending on the writing state of the at least one reference memory cell, writing the at least one memory cell, and writing the at least one reference memory cell to a given writing state.

48 Claims, 8 Drawing Sheets

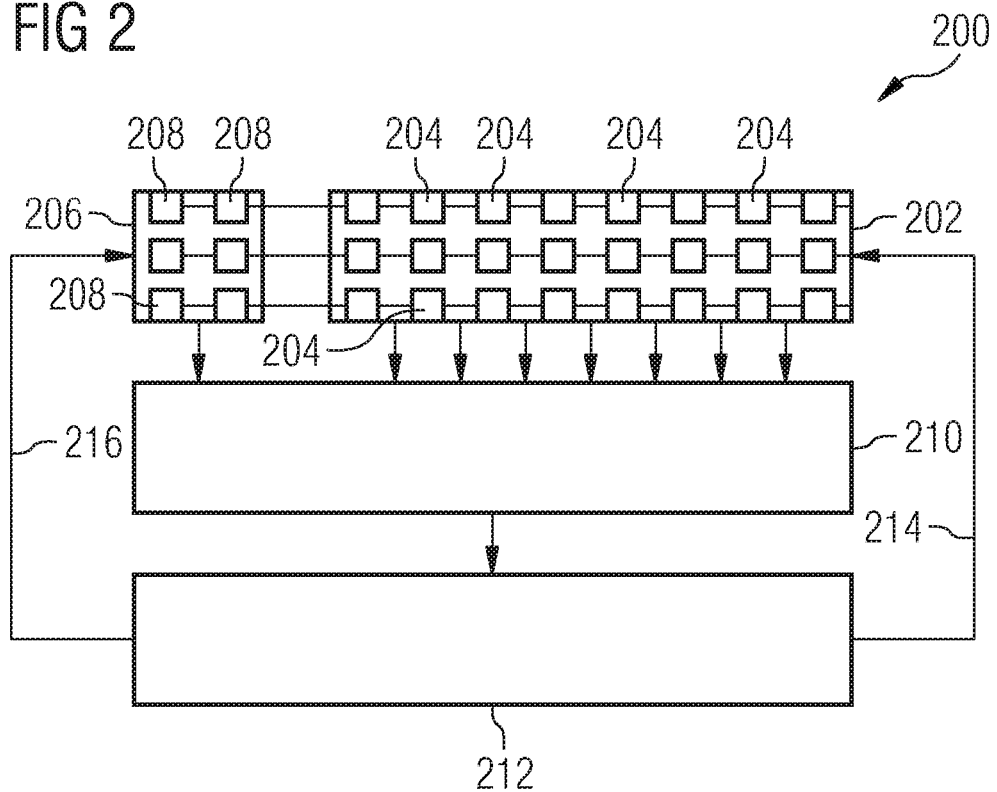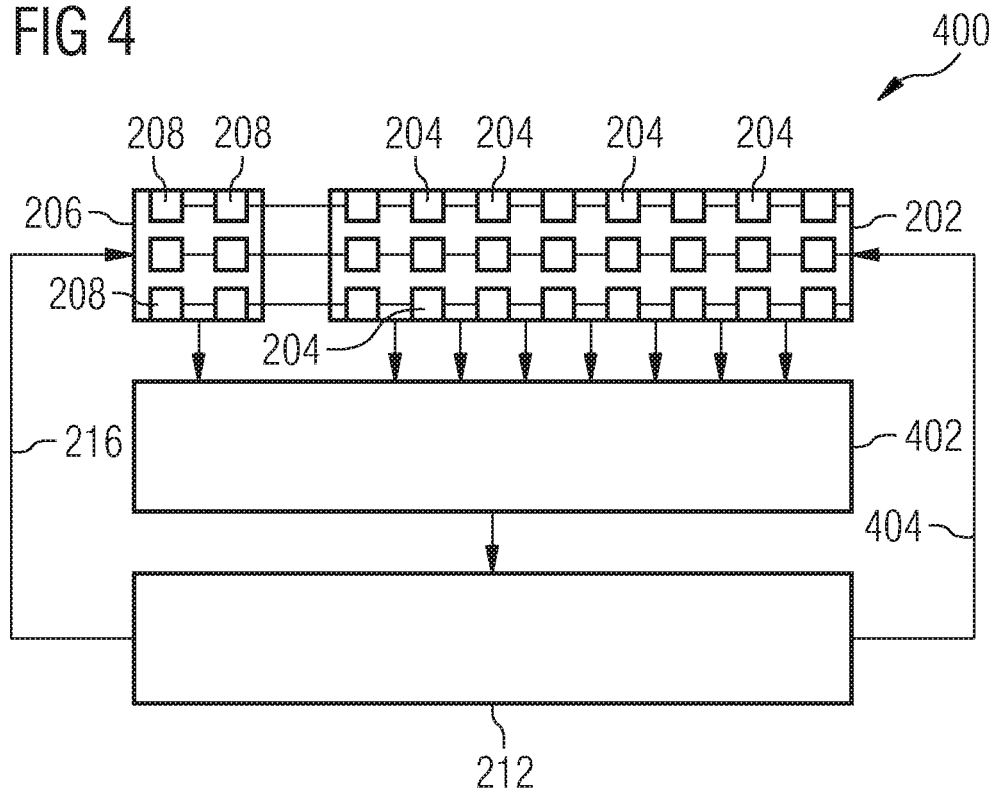

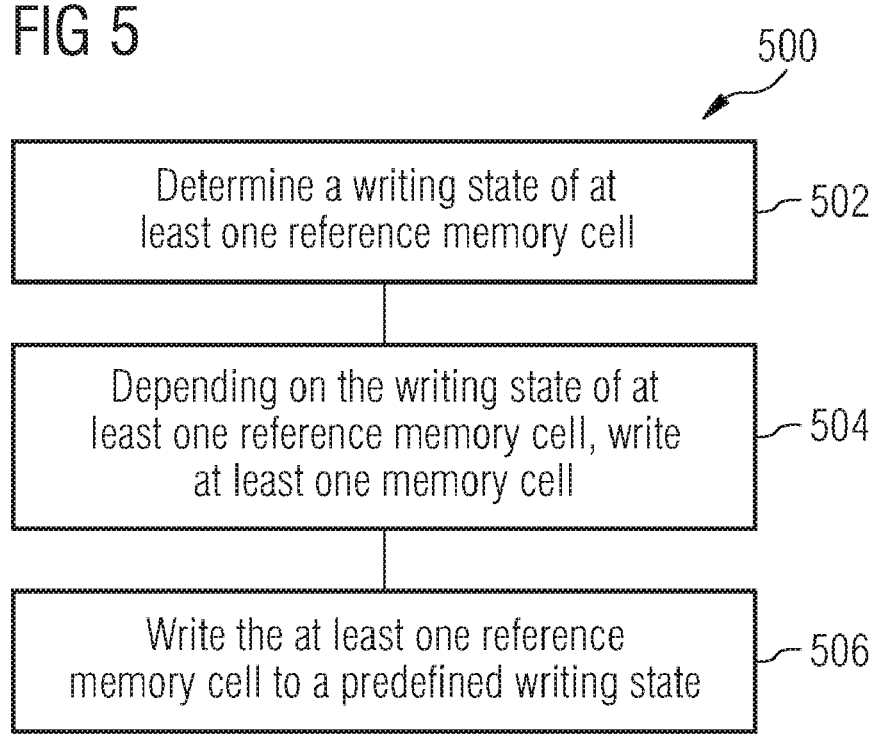
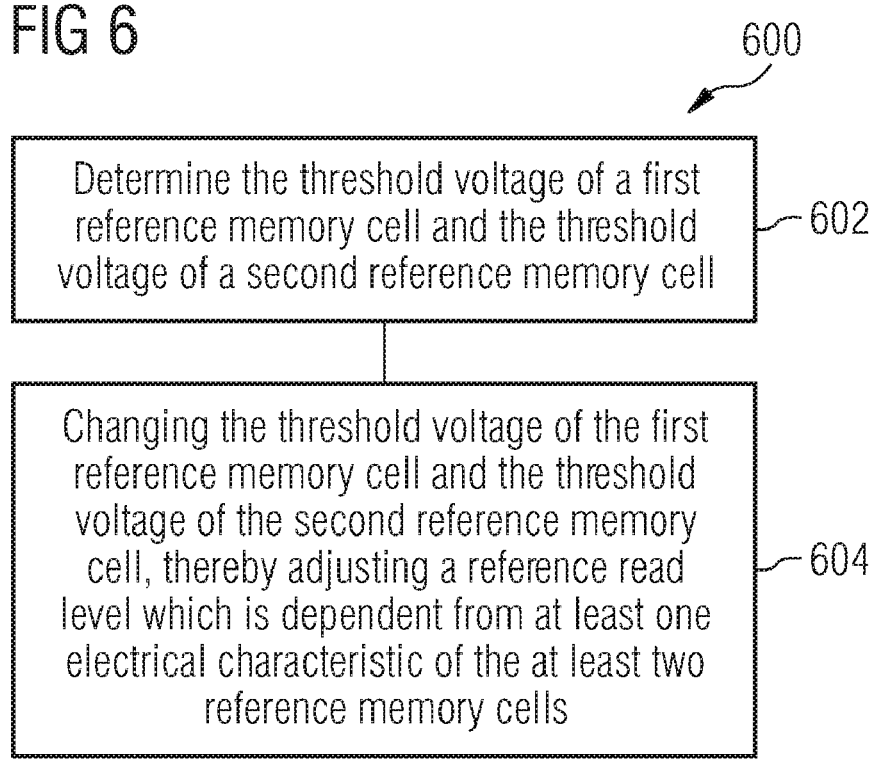

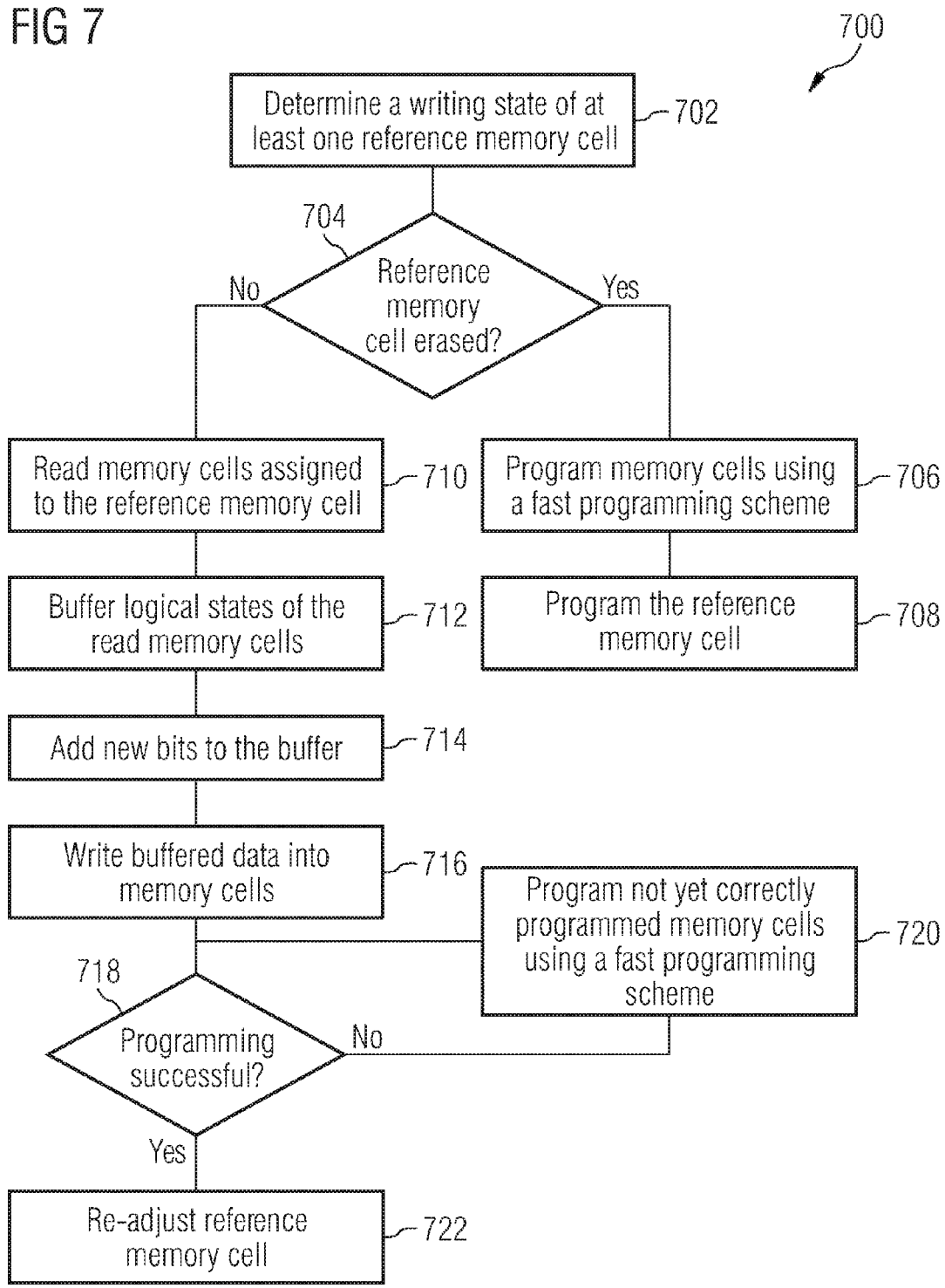

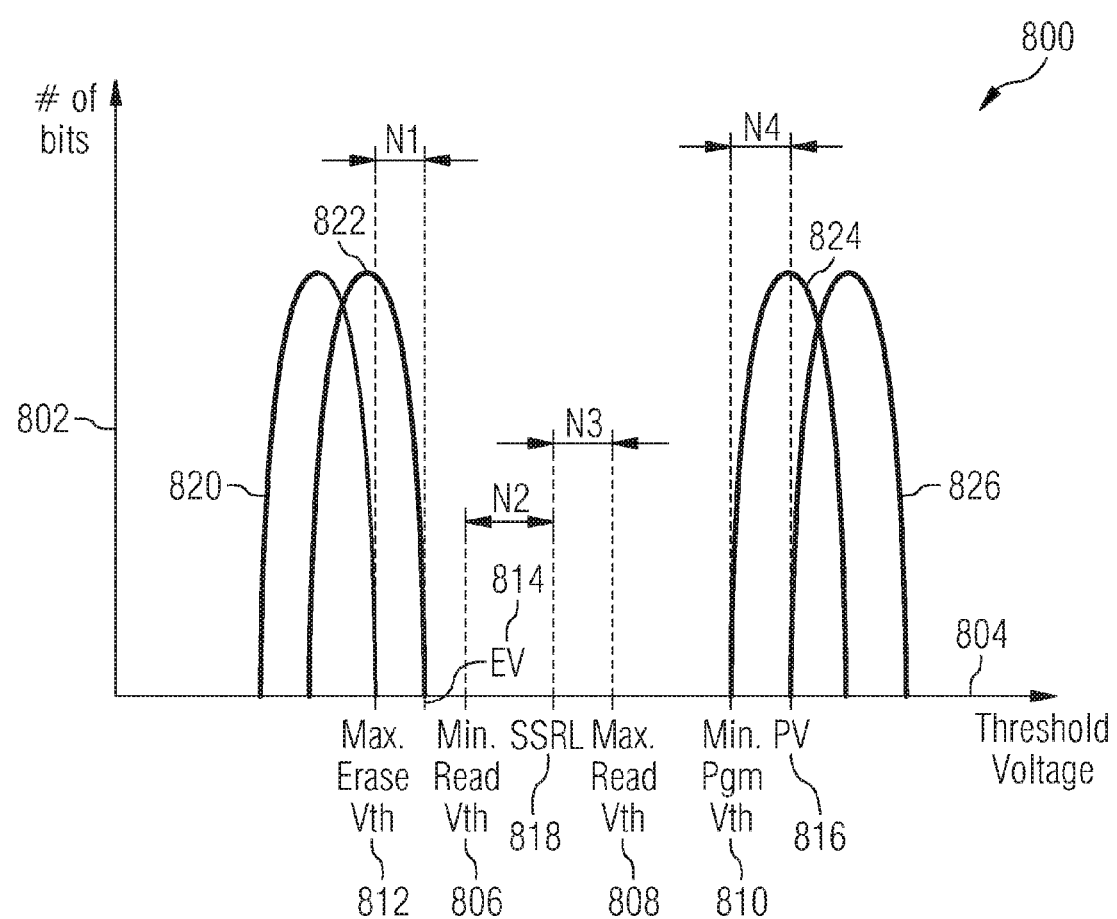

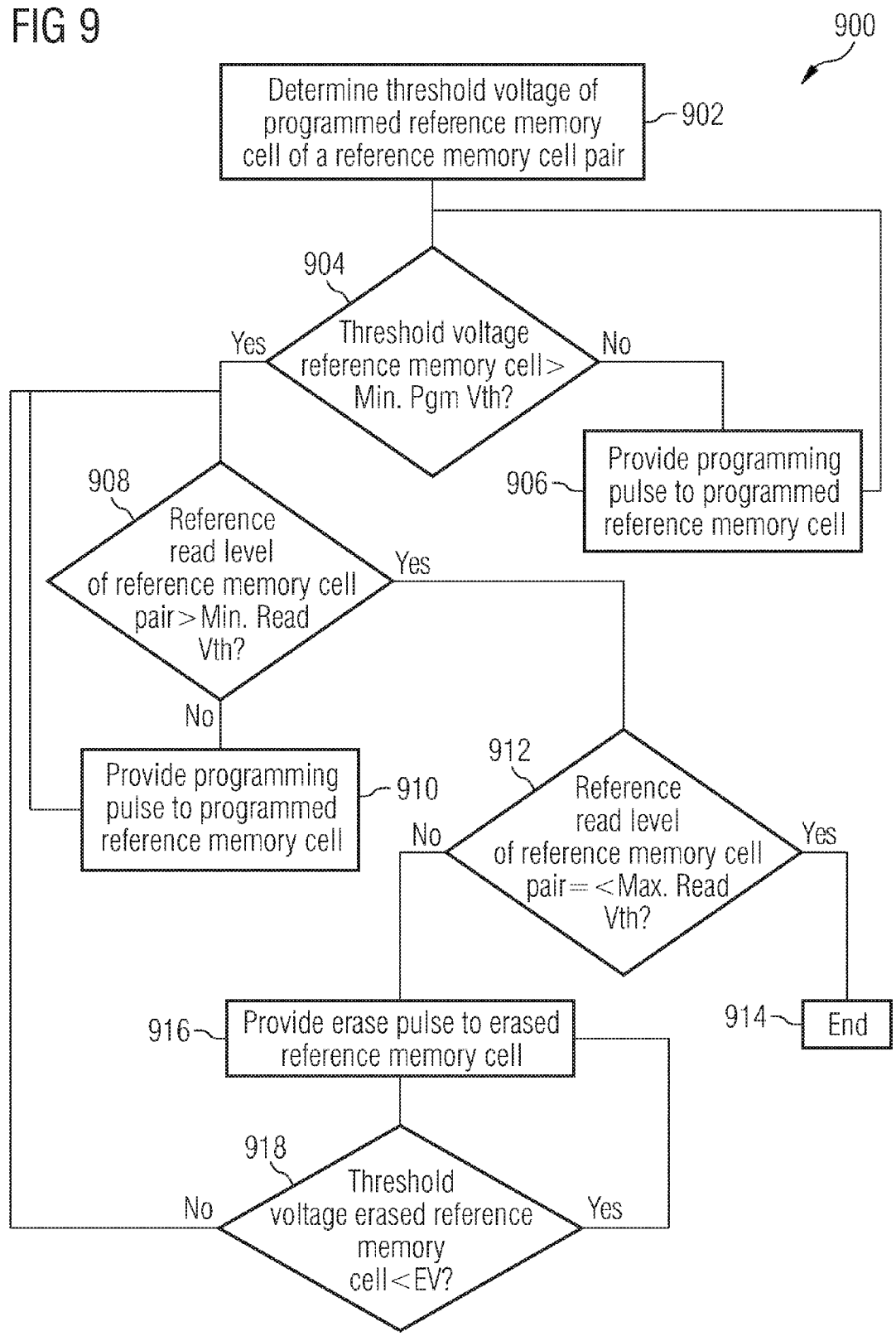

METHOD OF OPERATING AN INTEGRATED CIRCUIT HAVING AT LEAST ONE MEMORY CELL

TECHNICAL FIELD

Embodiments of the invention relate generally to a method of operating an integrated circuit having at least one memory cell; to a method of operating an integrated circuit having at least two memory cells; and to integrated circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows an integrated circuit including a configuration of a memory device in accordance with one embodiment of the invention;

FIG. 4 shows an integrated circuit including a configuration of a memory device in accordance with one embodiment of the invention;

FIG. 5 shows a diagram illustrating a method for writing at least one memory cell of an integrated circuit in accordance with one embodiment of the invention;

FIG. 6 shows a diagram illustrating a method for writing at least two memory cells of an integrated circuit in accordance with one embodiment of the invention;

FIG. 7 shows a diagram illustrating a method for writing at least two memory cells of an integrated circuit in accordance with one embodiment of the invention;

FIG. 8 shows a diagram illustrating threshold voltage distributions in accordance with one embodiment of the invention;

FIG. 9 shows a diagram illustrating a method for re-adjusting a reference memory cell of an integrated circuit in accordance with one embodiment of the invention.

DETAILED DESCRIPTION OF ILLUSTRATIVE EMBODIMENTS

As used herein the terms connected and coupled are intended to include both direct and indirect connection and coupling, respectively.

Furthermore, in the following description, a "circuit" may be understood e.g., as an electronic circuit, which may be hard wired logic or programmable logic such as a field programmable gate array or a programmable microprocessor, which is programmed to provide the respectively desired function.

Proper operation of memory devices requires accurate sensing of the logical states stored in the bits of memory cells within the device. Sensing of the logical states is typically accomplished through the application of a read voltage on a memory cell whose stored logical state is sought. The output current, and corresponding voltage, is compared to a read level voltage that is supplied by a reference cell intended to mimic both the program and erase states of the interrogated memory cell. The read level voltage is usually an average of an erase threshold voltage representing the turn on voltage of the memory cell when in an erased state, and a program threshold voltage representing the turn on voltage of the memory cell when in a programmed state. The memory cell output current/voltage is detected when activated at the read level, the level of the output current/voltage indicating the state of the memory cell.

While effective in reading the stored state of memory cells, the aforementioned approach has several effects, one being the time-dependent nature of the memory cells' erase threshold voltage and programming threshold voltage. By way of example, the program threshold voltage and erase threshold voltage will vary as the memory cells age or undergo changes in operating conditions, thereby requiring different voltages to program and erase the same memory cell. The reference cell will generally track changes in the program and erase threshold voltages; however, a common reference cell is typically used for a large number of memory cells, and thus the reference cell can track only an average change in these threshold voltages which reduces reading accuracy. Additonal reference cells could be employed, albeit at the expense of decreased storage capacity.

In an embodiment of the invention, a system and method for reading memory cell bits are provided which can accommodate changes in the program and erase threshold voltages.

Figure 1:
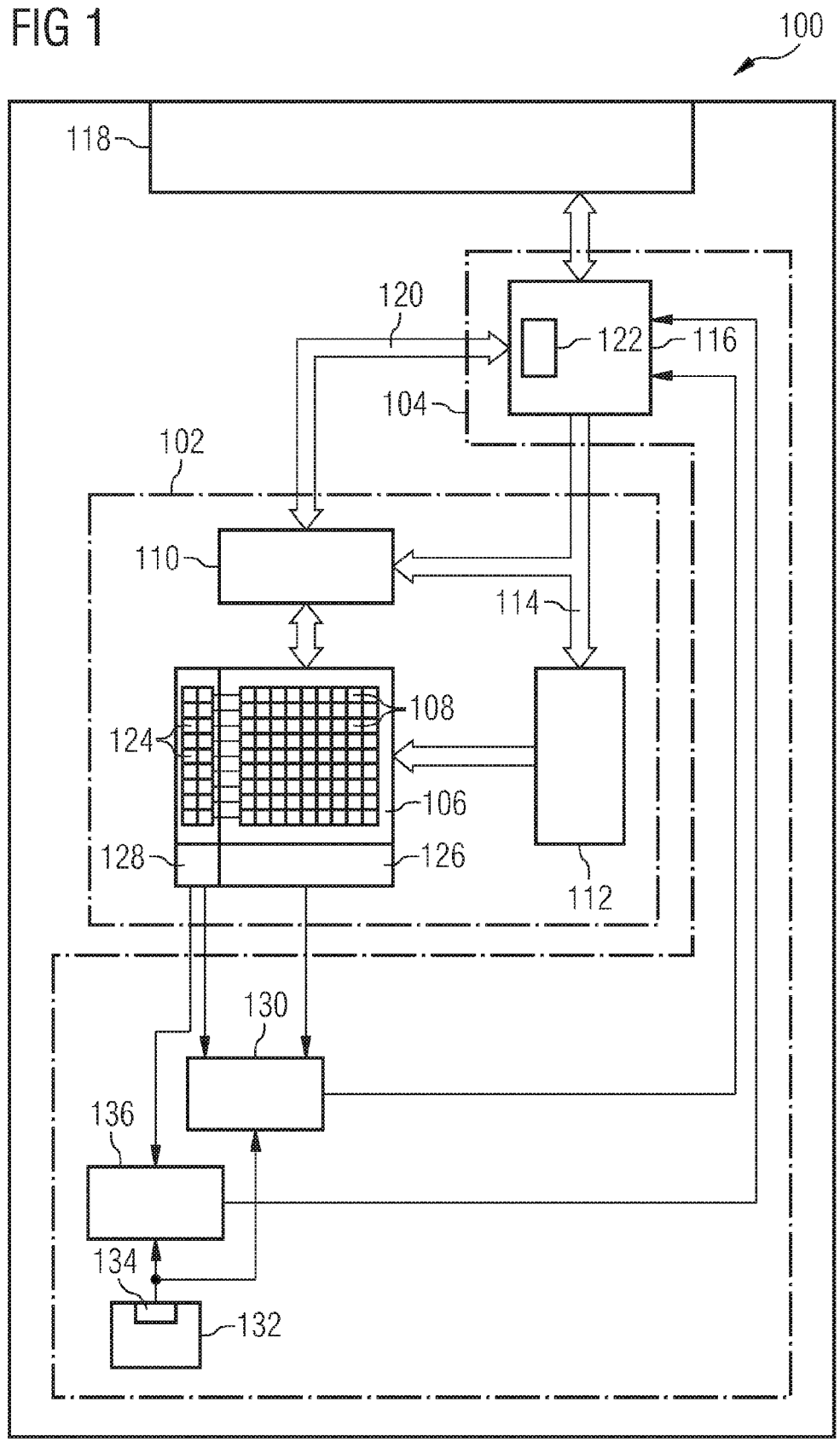
FIG. 1 shows an integrated circuit including a configuration of a memory device in accordance with one embodiment of the invention.

FIG. 1 illustrates an integrated circuit 100 including a configuration of a memory device that includes memory cells for storing data. In an embodiment of the invention, the memory device is a flash memory device and the memory cells are flash memory cells. In an embodiment of the invention, the flash memory device is an EEPROM (Electrically Erasable Programmable Read Only Memory) memory device including EEPROM memory cells. In an embodiment of the invention, the EEPROM memory device is a floating gate memory device and the EEPROM memory cells are floating gate memory cells. In another embodiment of the invention, the EEPROM memory device is a charge trapping memory device and the EEPROM memory cells are charge trapping memory cells.

However, it should be mentioned, that another embodiment of the invention may be employed to other memory devices such as, e.g., a magnetoresistive random access memory (MRAM) memory device having MRAM memory cells, a phase change random access memory (PCRAM) memory device having PCRAM memory cells, a conductive bridging random access memory (CBRAM) memory device having CBRAM memory cells as well as to other volatile and non-volatile memory cell structures and architectures.

In an embodiment of the invention, at least some memory cells are "multi-bit" memory cells. As used herein the term "multi-bit" memory cell is intended to, e.g., include memory cells which are configured to store a plurality of bits by spatially separated electric charge storage regions, thereby representing a plurality of logic states. In another embodiment of the invention, at least some memory cells are "multi-level" memory cells. As used herein the term "multi-level" memory cell is intended to, e.g., include memory cells which are configured to store a plurality of bits by showing distinguishable threshold voltages dependent on the amount of electric charge stored in the memory cell, thereby representing a plurality of logic states.

Moreover, in the context of this description, a "volatile memory cell" may be understood as a memory cell storing data, the data being refreshed during a power supply voltage of the memory system being active, in other words, in a state of the memory system, in which it is provided with power supply voltage. In an embodiment of the invention, a "volatile memory cell" may be understood as a memory cell storing data, the data being refreshed during a refresh period in which the memory cell is provided with a power supply voltage corresponding to the level of the stored data.

In contrast thereto, a "non-volatile memory cell" may be understood as a memory cell storing data, wherein the stored data are kept even when the power supply voltage of the memory system is not active. A "non-volatile memory cell" in the context of this description includes a memory cell, the stored data of which may be refreshed after an interruption of the external power supply. As an example, the stored data may be refreshed during a boot process of the memory system after the memory system had been switched off or had been transferred to an energy deactivation mode for saving energy, in which mode at least some or most of the memory system components are deactivated. Furthermore, the stored data may be refreshed on a regular timely basis, but not, as with a "volatile memory cell," every few picoseconds or nanoseconds or milliseconds, but rather in a range of hours, days, weeks or months. Alternatively, the data may not need to be refreshed at all in some designs.

In an embodiment of the invention, the charge trapping memory cells may include a charge trapping layer structure. The charge trapping layer structure may include a dielectric layer stack including one dielectric layer or at least two dielectric layers being formed above one another, wherein charge carriers can be trapped in at least one dielectric layer. By way of example, the charge trapping layer structure includes a charge trapping layer, which may include or consist of one or more materials being selected from a group of materials that consists of: aluminium oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment of the invention, the charge trapping layer structure includes a dielectric layer stack including three dielectric layers being formed above one another, e.g., a first oxide layer (e.g., silicon oxide), a nitride layer as a charge trapping layer (e.g., silicon nitride) on the first oxide layer, and a second oxide layer (e.g., silicon oxide or aluminum oxide) on the nitride layer. This type of dielectric layer stack is also referred to as an ONO layer stack. In an alternative embodiment of the invention, the charge trapping layer structure includes two, four or even more dielectric layers being formed above one another.

The memory device includes a memory area 102 and a circuitry area 104. In an embodiment of the invention, the memory area 102 includes a memory array 106 with a plurality of memory cells 108. The memory cells 108 are arranged in columns and rows, thereby constituting a memory cell matrix. In an alternative embodiment of the invention, the memory cells 108 may be arranged in any other suitable structure such as, e.g., in a zig-zag structure. In an embodiment of the invention, each of the memory cells 108 can be selected by means of a column decoder 110 and a row decoder 112. Both decoders 110, 112 are connected to an address bus 114, which is also connected to a control circuit 116 (e.g., hard-wired logic or programmable logic such as, e.g., a microprocessor) of the circuitry area 104. The control circuit 116 is connected to an input/output interface (I/O interface) 118 for receiving and sending data from an external device. For example, for reading data stored in the memory device, the control circuit 116 accesses the memory array 106 by sending an address to the column decoder 110 and the row decoder 112. The column decoder 110 extracts information as to which of the bit lines of the memory array 106 are to be selected. The row decoder 112 selects a word line, corresponding to the address transmitted from the control circuit 116. Data are transmitted between the control circuit 116 and the memory array 106 via a data bus 120. For reading and writing data, the control circuit 116 includes write and read circuits 122 to perform operations on the memory array 106.

For reading a memory cell 108, a current flowing through that memory cell 108 is compared with a current flowing through a memory array reference cell 124. In an embodiment of the invention, this is carried out using sense amplifiers 126 and 128. The sense amplifiers 126 are memory cell sense amplifiers 126, wherein each of the memory cell sense amplifiers 126 is connected to a respective bit line of the memory cell 108.

In accordance with an embodiment of the invention, memory array reference cells 124 are provided that are connected to the same word lines as the memory cells 108. In an embodiment of the invention, one reference cell 124 is provided for each of the word lines. In another embodiment of the invention, a set of at least two reference cells 124 are provided for each of the word lines. During operation of the memory device, one of the at least two reference cells 124 is configured to have a threshold value corresponding to an erased state of a memory cell and at least one other of the at least two reference cells 124 is configured to have a threshold voltage corresponding to a programmed state of a memory cell. Third memory array reference cells can be provided and configured to have a threshold voltage corresponding to an over-erased state of a memory cell. Supplementary memory array reference cells may be provided as status cells to indicate if all memory cells of a specified group of memory cells are erased. The memory array reference cells may be located at a location within or outside the memory array 106 (or within or outside a respective memory sector, the memory array reference cell (s) may be assigned to) which is very well representative of the applicable read threshold voltage therein. In an embodiment of the invention, where the distribution of, e.g., the threshold voltages of the memory cells or the reference memory cells are sector-specific, the memory array reference cell(s) may be located at a location within a respective sector (e.g., in the center of the sector) which is deemed as being very well representative of the applicable read threshold voltage therein. In another embodiment of the invention, memory array reference cells may be located at a location within or outside the memory array 106 which is very well representative of the applicable read threshold voltage over the entire memory integrated circuit 100. In an embodiment of the invention, no edge bits are implemented in forming the memory array reference cells.

Depending on the type of memory device, a different number of memory cells may be provided per memory array reference cell (or memory array reference cell pair, for example). In an embodiment of the invention, in which the memory device is provided to store computer program code data (e.g., also referred to as a code flash memory device), e.g., 64 memory cells (in alternative embodiments, e.g., 128 memory cells, 256 memory cells, 512 memory cells or 1,024 memory cells) may be provided per memory array reference cell (or memory array reference cell pair, for example). In an embodiment of the invention, in which the memory device is provided to store data, e.g., user data (e.g., also referred to as a data flash memory device), e.g., thousands of memory cells (e.g., 4,000 memory cells, 16,000 memory cells or 32,000 memory cells) may be provided per memory array reference cell (or memory array reference cell pair, for example).

The memory cell sense amplifiers 126 are provided for measuring a respective current flowing through the memory cells 108 of the memory array 106. The memory array reference sense amplifiers 128 are provided for measuring a respective current flowing through the memory array reference cells 124. A memory array evaluation circuit 130 is connected to the memory cell sense amplifiers 126 and to the memory array reference sense amplifiers 128. By comparing the signals received from the memory cell sense amplifiers 126 and the memory array reference sense amplifiers 128, a result signal is generated, which indicates a logical state of a selected memory cell 108.

This procedure for reading the logical state of a selected memory cell 108 is carried out each time the stored data is requested, for example by a host system, which may be connected to the I/O interface 118 or if the logical state of a memory cell 108 is to be verified and therefore to be read after an erasing or a programming operation.

In the context of this description, "writing" may be understood as to set the state of a memory cell to an erased state or a programmed state. Thus, the "writing state" of a memory cell indicates whether the memory cell is in an erased state or in a programmed state. "Programming" may be understood as to set the state of a memory cell to a first logical value and "erasing" may be understood as to set the state of a memory cell to a second logical value. In an embodiment of the invention, the "writing state" may denote a distinguishable threshold voltage value of the memory state.

In an embodiment of the invention, it is desired to provide a reference value that is sufficiently accurate in order to enable a sharp and tight program/erase differentiation. This is particularly valuable in a multi-bit memory cell or in a multi-level memory cell, e.g., in the case of two bit nitrided read only memory (NROM) memory cells.

In an embodiment of the invention, the memory array reference cells 124 are arranged next to the memory cells 108 that are to be read. They are also treated as normal memory cells 108 and, therefore, exhibit the same behavior in time and during write cycles as memory cells 108 and are subject to the same temperature variations, for example. Also, other kinds of disturbances in this case will typically affect the memory array reference cells 124 in the same manner as the memory cells 108. The respective memory cells 108 are connected to the same word line as the assigned memory array reference cells 124. Therefore, the selection of a memory cell 108 by activating a word line also activates the respective memory array reference cells 124. This mechanism helps to provide that the current flowing through a memory cell 108 and through respective memory array reference cells 124 are measured at the same time.

For providing more exact reference values and according to an embodiment of the invention, it is proposed to provide a set of main reference cells 132, which are used as a reference for writing reference values to the memory array reference cells 124. Main reference sense amplifiers 134 are provided and are connected to the memory array evaluation circuit 130. Therefore, in an embodiment of the invention, the memory cells 108 of the memory array 106 can also be read or verified using the main reference cells 132. In general, for reading stored data, the memory array reference cells 124 are used, since these provide references that are degraded in the same manner as the data stored in the memory cells 108. Additionally, this prevents the main reference cells 132 from further stress, which could degrade the threshold values of the main reference cells 132. The memory array reference cells 124 and the memory cells 108 assigned to this row can later be refreshed using the references provided by the main reference cells 132.

For setting the memory array reference values, the same mechanism is implemented as already explained for the reading of memory cells. As described above, a current through a memory array reference cell 124 can be measured by the memory array reference sense amplifier(s) 128. A current through the main reference cells 132 is measured by main reference sense amplifiers 134. Both sense amplifiers 128 and 134 are connected to a main evaluation circuit 136, which compares the values measured by the sense amplifiers 128 and 134 and outputs a signal indicating the logical state of a measured memory array reference cell 124. In contrast to the setting of memory cells using the memory array reference cells 124, the main reference cells 132 and the memory array reference cells 124 are not connected to the same word line. The main reference cells 132 are controlled by an additional control signal. In an embodiment of the invention, the main reference cells 132 may be set by the manufacturer of the integrated circuit, e.g., before the shipping of the integrated circuit to a customer.

Both the memory array evaluation circuit 130 and the main evaluation circuit 136 are connected to the control circuit 116. For setting a memory array reference cell 124 to a dedicated state, the actual state is detected by the sense amplifiers 128 and 134 and the main evaluation circuit 136. The state is reported to the write circuit 122 of the control circuit 116 and, if necessary, a write operation is performed. After writing data to the memory array reference cell 124, a read operation is performed to verify if the write operation was sufficient to reach the state as required.

In the embodiment shown in FIG. 1, two sense amplifiers 126, 128 are provided for evaluating the state of a memory cell 108 or of a memory array reference cell 124. Both sense amplifiers 126, 128 are connected to the memory array evaluation circuit 130 for generating a signal corresponding to the detected logical state. Other kinds of sense amplifiers are available, which directly compare the measured currents through the memory cell 108 or the memory array reference cell 124, respectively, and generate a corresponding output signal. The embodiments of the invention can be applied independent from the used sense amplifiers so that all kinds of sense amplifiers can be used.

FIG. 2 shows an integrated circuit 200 including a configuration of a memory device in accordance with one embodiment of the invention.

The integrated circuit 200 includes a memory cell field 202 such as e.g., a memory cell array having at least one memory cell 204. Any type of memory cell which has been described with reference to FIG. 1 may also be used in this embodiment of the invention. Furthermore, in an embodiment of the invention, an arbitrary number of memory cells may be provided. In an embodiment of the invention, the memory cells 204 are grouped together such that the memory cells 204 of each group of memory cells (e.g., a memory cell sector; in an embodiment, a memory cell sector includes 256 memory bits, although any number of bits may be used in alternative embodiments in a memory cell sector) is connected together by means of a respective control line (e.g., a word line). In an embodiment of the invention, the memory cells 204 of each group are further serially source-to-drain coupled with each other, e.g., in accordance with a NAND memory cell structure. In this embodiment of the invention, each group of memory cells 204 may form a respective NAND memory cell string, which will be described in more detail below.

Figure 3:
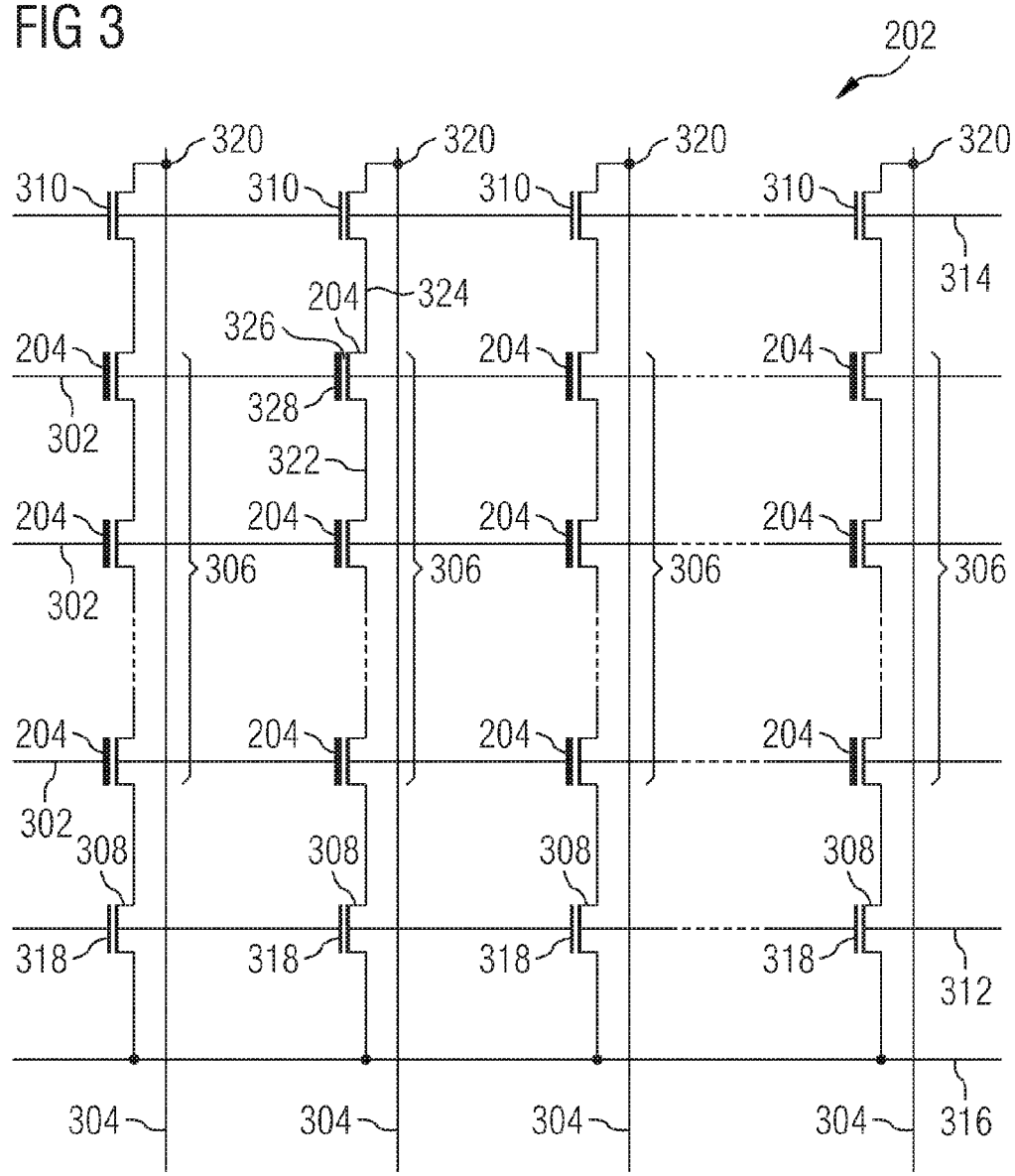
FIG. 3 shows a memory cell field in accordance with an embodiment of the invention.

FIG. 3 shows a portion of the memory cell field 202 in accordance with an embodiment of the invention. It should be noted that any other suitable architecture of the memory cells 204 in the memory cell field 202 than the architecture shown in FIG. 3 may be used in an alternative embodiment of the invention.

In one embodiment of the invention, the memory cell field 202 is a NAND memory cell array 202 as a part of a memory device (in general, as a part of an electronic device including the memory cell field 202). The NAND memory cell array 202 includes word lines 302 (in general, an arbitrary number of word lines 302, in one embodiment of the invention, 1,024 word lines 302) and intersecting bit lines 304 (in general, an arbitrary number of bit lines 304, in one embodiment of the invention, 512 bit lines 304).

The NAND memory cell array 202 includes NAND strings 306, each NAND string 306 having memory cells (e.g., charge trapping memory cells or floating gate memory cells) 204. Furthermore, an arbitrary number of memory cells 204 can be provided in the NAND string 306, in accordance with one embodiment of the invention, 32 memory cells 204. The memory cells 204 are connected in series source-to-drain between a source select gate 308, which may be implemented as a field effect transistor, and a drain select gate 310, which may also be implemented as a field effect transistor. Each source select gate 308 is positioned at an intersection of a bit line 304 and a source select line 312. Each drain select gate 310 is positioned at an intersection of a bit line 304 and a drain select line 314. The drain of each source select gate 308 is connected to the source terminal of the first memory cells 204 of the corresponding NAND string 306. The source of each source select gate 308 is connected to a common source line 316. A control gate 318 of each source select gate 308 is connected to the source select line 312.

In one embodiment of the invention, the common source line 316 is connected between source select gates 308 for NAND strings 306 of two different NAND arrays (one of which is shown in FIG. 3 and the other one is not shown in FIG. 3). Thus, the two NAND arrays share the common source line 316.

In an embodiment of the invention, the drain of each drain select gate 310 is connected to the bit line 304 of the corresponding NAND string 306 at a drain contact 320. The source of each drain select gate 310 is connected to the drain of the last memory cell 204 of the corresponding NAND string 306. In one embodiment of the invention, at least two NAND strings 306 share the same drain contact 320.

In accordance with the described embodiments, each memory cell 204 includes a source 322 (e.g., a first source/drain region), a drain 324 (e.g., a second source/drain region), a charge storage region 326 (e.g., a dielectric layer stack or a floating gate stack) and a control gate 328 (e.g., a gate region). The control gate 328 of each memory cell 204 is connected to a respective word line 302. A column of the NAND memory cell array 202 includes a respective NAND string 306 and a row of the NAND memory cell array 202 includes those memory cells 204 that are commonly connected to a respective word line 302.

In an alternative embodiment of the invention, the memory cell field 202 is a NOR memory cell array 202. In yet another embodiment of the invention, the memory cell field 202 may be arranged in accordance with any other suitable architecture.

The integrated circuit 200 further includes a reference memory cell field 206. In an embodiment of the invention, the reference memory cell field 206 includes at least one reference memory cell 208, in an embodiment of the invention, a plurality of reference memory cells 208. In an embodiment of the invention, a predefined number of reference memory cells 208 is respectively assigned to a predefined number of memory cells 204 in the memory cell field 202. In an embodiment of the invention, one reference memory cell 208 is assigned to each memory cell group (e.g., to each memory cell sector or to each NAND memory cell string 306), e.g., to each memory cell group which includes a plurality of memory cells 204 being coupled via a control line (e.g., a respective common word line 302). In another embodiment of the invention, two reference memory cells 208 (e.g., forming a respective pair of reference memory cells 208; in an embodiment, the memory cells of a respective pair of reference memory cells 208 may be inversely programmed (for example, a first reference cell of the reference cell pair may be programmed into a first programming state (e.g., with a logic "0") and a second reference cell of the reference cell pair may be programmed into a second programming state, which is different from the first programming state, (e.g., with a logic "1"))) is assigned to each memory cell group (e.g., to each memory cell sector or to each NAND memory cell string 306), e.g., to each memory group which includes a plurality of memory cells 204 being coupled via a control line (e.g., a respective common word line 302). In an embodiment of the invention, the at least one reference memory cell 208 and the at least one memory cell 204 are of the same type of memory cell (in an example, the at least one reference memory cell 208 and the at least one memory cell 204 are both charge trapping memory cells, in another example, the at least one reference memory cell 208 and the at least one memory cell 204 are both floating gate memory cells).

The integrated circuit 200 further includes a determination circuit 210 (e.g., implemented by a memory array evaluation circuit (e.g., 130)) to determine a writing state of the at least one reference memory cell 208. The writing state may be an erased state or a programmed state, for example.

In an embodiment of the invention, the determination circuit 210 is configured to determine the writing state of the at least one reference memory cell 208 by comparing at least one electrical characteristic of the at least one reference memory cell 208 with at least one electrical reference characteristic of at least one global reference memory cell (e.g., implemented by the one or more main reference cells 132) which is assigned to a plurality of the reference memory cells 208.

In an embodiment of the invention, the determination circuit 210 is configured to determine whether a reference read level (which will be described in more detail below) is within a predefined reference read level margin. Furthermore, the write circuit 212 may be configured, depending on whether the reference read level is within the predetermined reference read level margin, to apply at least one write pulse to at least one reference memory cell 208 of the at least two reference memory cells 208.

In another embodiment of the invention, the determination circuit 210 is configured to determine whether the threshold voltage of a first reference memory cell 208 of the at least two reference memory cells 208 is higher than a predefined first reference read level threshold (which may be a self-synchronized program verify level threshold or a self-synchronized program verify level threshold minus a first offset value, wherein the first offset value may be in the range of about 150 mV to about 500 mV, e.g., in the range of about 250 mV to about 400 mV, e.g., in the range of about 300 mV to about 350 mV), and, in case the threshold voltage of the first reference memory cell 208 of the at least two reference memory cells 208 is higher than the predefined first reference read level threshold, to determine whether the reference read level is higher than a predefined second reference read level threshold (which may be a first self-synchronized read verify level threshold or a first self-synchronized read verify level threshold minus a second offset value, wherein the second offset value may be in the range of about 250 mV to about 600 mV, e.g., in the range of about 350 mV to about 500 mV, e.g., in the range of about 400 mV to about 450 mV) and lower than a predefined third reference read level (which may be a second self-synchronized read verify level threshold or a second self-synchronized read verify level threshold plus a third offset value, wherein the third offset value may be in the range of about 80 mV to about 300 mV, e.g., in the range of about 100 mV to about 250 mV, e.g., in the range of about 150 mV to about 200 mV), wherein the predefined third reference read level is higher than the predefined second reference read level.

In an embodiment of the invention, the expression "self-synchronized" may express that the respective parameter depends on the respective threshold voltage distributions of a plurality of memory cells and thus varies with each set of a plurality of memory cells.

Furthermore, a write circuit 212 is provided in the integrated circuit 200 to write, depending on the writing state of the at least one reference memory cell 208, the at least one memory cell 204 (symbolized by a first write coupling 214 in FIG. 2) and to write the at least one reference memory cell 208 to a given writing state (e.g., to a predefined writing state) (symbolized by a second write coupling 216 in FIG. 2), as will be described in more detail below.

In an embodiment of the invention, the write circuit 212 is configured, in case that the writing state of the at least one reference memory cell 208 is a first writing state, to write the at least one reference memory cell 208 using a first memory cell writing scheme. Furthermore, in an embodiment of the invention, the write circuit 212 is configured, in case that the writing state of the at least one reference memory cell 208 is a second writing state, to write the at least one reference memory cell 208 using a second memory cell writing scheme.

In an embodiment of the invention, the first writing state indicates that the at least one reference memory cell 208 is erased. In an embodiment of the invention, the second writing state indicates that the at least one reference memory cell 208 has already been programmed or re-programmed.

The first memory cell writing scheme may include applying at least one writing pulse having a higher voltage to the at least one memory cell 204 than at least one programming pulse provided in the second memory cell programming scheme or having a longer duration than the at least one programming pulse provided in the second memory cell programming scheme.

In an embodiment of the invention, at least two reference memory cells 208 are provided. In this embodiment of the invention, the write circuit 212 is configured to write at least one reference memory cell 208 of the at least two reference memory cells 208, thereby setting a reference read level which is dependent from at least one electrical characteristic of the at least two reference memory cells 208.

In an embodiment of the invention, the write circuit 212 is configured to write both reference memory cells 208, thereby setting a reference read level which is dependent from at least one electrical characteristic of the at least two reference memory cells 208.

In an embodiment of the invention, the write circuit 212 is configured to write a first reference memory cell 208 to a first writing state and the second reference memory cell 208 to a second writing state.

In an embodiment of the invention, the write circuit 212 may be configured, in case the reference read level is higher than the predefined second reference read level threshold, to increase the threshold voltage of the first reference memory cell 208 of the at least two reference memory cells 208.

The first reference memory cell 208 may be a programmed reference memory cell 208.

Furthermore, the write circuit 212 may be configured, in case the reference read level is higher than the predefined third reference read level threshold, to reduce the threshold voltage of the second reference memory cell 208 of the at least two reference memory cells 208.

The second reference memory cell 208 may be an erased reference memory cell 208.

In this example, in an embodiment of the invention, the determination circuit 210 may be configured to determine whether the reduced threshold voltage of the second reference memory cell 208 of the at least two reference memory cells 208 is above a fourth reference read level threshold (which may be a self-synchronized erase verify level threshold or a self-synchronized erase verify level threshold minus a fourth offset value, wherein the fourth offset value may be in the range of about 120 mV to about 350 mV, e.g., in the range of about 150 mV to about 300 mV, e.g., in the range of about 200 mV to about 250 mV). Furthermore, in this embodiment of the invention, the write circuit 212 may be configured, in case that the reduced threshold voltage of the second reference memory cell 208 of the at least two reference memory cells 208 is above the fourth reference read level threshold, to further decrease the threshold voltage of the second reference memory cell 208.

In an embodiment of the invention, the plurality of memory cells 204 may be connected with one common control line such as e.g., one common word line (e.g., 302), wherein the at least one reference cell 208 is assigned to the plurality of memory cells 204.

In all described embodiments, there may be provided a plurality of sense amplifiers, wherein at least one memory cell sense amplifier is provided for the at least one memory cell 204. In this embodiment of the invention, at least one reference sense amplifier may be provided for the at least one reference memory cell 208.

In an embodiment of the invention, which is shown in FIG. 4, an integrated circuit 400 is provided.

The integrated circuit 400 includes a memory cell field 202, which is similar to the memory cell field 202 shown in FIG. 2. Furthermore, in this embodiment, at least two reference memory cells 208 are provided. The integrated circuit 400 is similar to the integrated circuit 200 shown in FIG. 2 with some differences, which will be described in more detail below.

Instead of the determination circuit 210, a determination circuit 402 is provided to determine the threshold voltage of a first reference memory cell 208 of the at least two reference memory cells 208 and the threshold voltage of a second reference memory cell 208 of the at least two reference memory cells 208.

In an embodiment of the invention, the determination circuit 402 is configured to determine whether the threshold voltage of a first reference memory cell 208 of the at least two reference memory cells 208 is higher than a predefined first reference read level threshold (which may be a self-synchronized program verify level threshold or a self-synchronized program verify level threshold minus a first offset value, wherein the first offset value may be in the range of about 300 mV to about 500 mV, e.g., in the range of about 150 mV to about 300 mV), and, in case the threshold voltage of the first reference memory cell 208 of the at least two reference memory cells 208 is higher than the predefined first reference read level threshold, to determine whether the reference read level is higher than a predefined second reference read level threshold (which may be a first self-synchronized read verify level threshold or a first self-synchronized read verify level threshold minus a second offset value, wherein the second offset value may be in the range of about 250 mV to about 600 mV, e.g., in the range of about 350 mV to about 500 mV, e.g., in the range of about 400 mV to about 450 mV) and lower than a predefined third reference read level (which may be a second self-synchronized read verify level threshold or a second self-synchronized read verify level threshold plus a third offset value, wherein the third offset value may be in the range of about 80 mV to about 300 mV, e.g., in the range of about 100 mV to about 250 mV, e.g., in the range of about 150 mV to about 200 mV), wherein the predefined third reference read level is higher than the predefined second reference read level.

Furthermore, in this embodiment of the invention, a reference read level adjusting circuit 404 is provided to change the threshold voltage of a first reference memory cell 208 of the at least two reference memory cells 208 and the threshold voltage of a second reference memory cell 208 of the at least two reference memory cells 208, thereby adjusting a reference read level which is dependent from at least one electrical characteristic of the at least two reference memory cells 208.

In an embodiment of the invention, the reference read level adjusting circuit 404 is configured, in case the reference read level is higher than the predefined second reference read level threshold, to increase the threshold voltage of the first reference memory cell 208 of the at least two reference memory cells 208.

In an embodiment of the invention, the first reference memory cell 208 is a programmed reference memory cell 208.

Furthermore, the reference read level adjusting circuit may be configured, in case the reference read level is higher than the predefined third reference read level threshold, to reduce the threshold voltage of the second reference memory cell 208 of the at least two reference memory cells 208.

In an embodiment of the invention, the second reference memory cell 208 is an erased reference memory cell 208. In this embodiment of the invention, the determination circuit 402 may be configured to determine whether the reduced threshold voltage of the second reference memory cell 208 of the at least two reference memory cells 208 is above a fourth reference read level threshold (which may be a self-synchronized erase verify level threshold or a self-synchronized erase verify level threshold minus a fourth offset value, wherein the fourth offset value may be in the range of about 120 mV to about 350 mV, e.g., in the range of about 150 mV to about 300 mV, e.g., in the range of about 200 mV to about 250 mV), and, in case that the reduced threshold voltage of the second reference memory cell 208 of the at least two reference memory cells 208 is above the minimum read level threshold, to further decrease the threshold voltage of the second reference memory cell 208.

FIG. 5 shows a diagram 500 illustrating a method for writing at least one memory cell of an integrated circuit in accordance with one embodiment of the invention.

At 502, a writing state of at least one reference memory cell (e.g., 208) is determined.

As described above, in an embodiment of the invention, the "writing state" of a memory cell indicates whether the memory cell is in an erased state or in a programmed state. "Programming" may be understood as to set the state of a memory cell to a first logical value and "erasing" may be understood as to set the state of a memory cell to a second logical value. Thus, In an embodiment of the invention, at 502, it may be determined as to whether the at least one reference memory cell (e.g., 208) is erased or programmed (or re-programmed).

At 504, depending on the writing state of the at least one reference memory cell, at least one memory cell is written. In an embodiment of the invention, a plurality of memory cells in the memory cell field (e.g., 106 or 202) are written, e.g., in accordance with a received write request.

At 506, the at least one reference memory cell is written to a given writing state (e.g., to a predefined writing state). In an embodiment of the invention, the at least one reference memory cell is written shortly before the writing of the at least one memory cell, at the same time the at least one memory cell is written, or shortly after the writing of the at least one memory cell. In this context, the expression "shortly" may be understood as indicating a time period which is sufficiently short so that the written at least one reference memory cell and the written at least one memory cell undergo substantially similar or similar writing conditions such as external temperature, etc., and that the threshold voltages of the written at least one reference memory cell and the written at least one memory cell are similar when they represent the same logical value (e.g., erased or programmed). Thus, the written at least one reference memory cell is illustratively re-freshed when the at least one memory cell is written, e.g., in a case where some memory cells of the same group of memory cells have already been written before (and thus the assigned at least one reference memory cell has also been written before), thereby reducing a moving window effect of the moving of the reference read level over time. Thus, in an embodiment, the reference read level provided by the at least one reference memory cell is adjusted to the writing states of the written memory cells. In an embodiment of the invention, the at least one memory cell and the at least one reference memory cell are written within a predefined time period. In an embodiment of the invention, the predefined time period is up to about a couple of days, e.g., up to about a day, e.g., up to about a couple of hours (e.g., up to about 12 hours, e.g., up to about 10 hours, e.g., up to about 8 hours, e.g., up to about 4 hours, e.g., up to about 2 hours, e.g., up to about 1 hour), e.g., up to about a couple of minutes (e.g., up to about 30 minutes, e.g., up to about 15 minutes, e.g., up to about 10 minutes, e.g., up to about 5 minutes, e.g., up to about 2 minutes, e.g., up to about 1 minute), e.g., up to about a couple of seconds (e.g., up to about 30 seconds, e.g., up to about 15 seconds, e.g., up to about 10 seconds, e.g., up to about 5 seconds), e.g., up to about a couple of milliseconds (ms) (e.g., up to about 500 ms, e.g., up to about 250 ms, e.g., up to about 125 ms, e.g., up to about 50 ms, e.g., up to about 20 ms, e.g., up to about 10 ms, e.g., up to about 5 ms, e.g., up to about 1 ms), e.g., up to about a couple of microseconds (µs) (e.g., up to about 500 µs, e.g., up to about 250 µs, e.g., up to about 125 µs, e.g., up to about 50 µs, e.g., up to about 20 µs, e.g., up to about 10 µs, e.g., up to about 5 µs, e.g., up to about 1 µs). In an embodiment of the invention, the at least one memory cell and the at least one reference memory cell are written simultaneously.

In an embodiment of the invention, the at least one reference memory cell is assigned to the at least one memory cell.

In an embodiment of the invention, when the writing state of the at least one reference memory cell is a first writing state (the first writing state may indicate that the at least one reference memory cell is erased), the at least one memory cell is written using a first memory cell writing scheme. Further, when the writing state of the at least one reference memory cell is a second writing state (the second writing state may indicate that the at least one reference memory cell has already been programmed or re-programmed), the at least one memory cell is written using a second memory cell writing scheme. In an embodiment of the invention, the first memory cell writing scheme includes applying at least one writing pulse having a higher voltage to the at least one memory cell than at least one programming pulse provided in the second memory cell programming scheme or having a longer duration than the at least one programming pulse provided in the second memory cell programming scheme.

In an embodiment of the invention, the writing state of the at least one reference memory cell is determined by comparing at least one electrical characteristic of the at least one reference memory cell with at least one electrical reference characteristic of at least one global reference memory cell which is assigned to a plurality of reference memory cells. The at least one electrical characteristic may be the threshold voltage of the at least one reference memory cell and the at least one memory cell, respectively.

In an embodiment of the invention, a write request to write at least one memory cell may be received, and upon receiving the write request, the writing state of the at least one reference memory cell may be determined. In an alternative embodiment of the invention, the determination of the writing state of the at least one reference memory cell may be provided if it is predicted that the at least one assigned memory cell might be written in the future, even when no write request has been received for the particular at least one memory cell to which the at least one reference memory cell is assigned.

In an embodiment of the invention, at least two reference memory cells are provided, which may both be assigned to the same at least one memory cell. In this embodiment, at least one reference memory cell of the at least two reference memory cells may be written, thereby setting a reference read level which is dependent from at least one electrical characteristic of the at least two reference memory cells. In this embodiment, the at least two reference memory cells may both be written, thereby setting a reference read level which is dependent from at least one electrical characteristic of the at least two reference memory cells. The at least two reference memory cells may be written such that a first reference memory cell is written to a first writing state and the second reference memory cell is written to a second writing state.

In an embodiment of the invention, the process of writing the at least two reference memory cells (e.g., 506) may include a process of determining whether the reference read level is within a predefined reference read level margin, and depending on whether the reference read level is within the predetermined reference read level margin, a process of applying at least one write pulse to at least one reference memory cell of the at least two reference memory cells.

In an embodiment of the invention, the process of writing the at least two reference memory cells (e.g., 506) may include a process of determining whether the threshold voltage of a first reference memory cell of the at least two reference memory cells is higher than a predefined first reference read level threshold, and, in case the threshold voltage of the first reference memory cell of the at least two reference memory cells is higher than the predefined first reference read level threshold, a process of determining whether the reference read level is higher than a predefined second reference read level threshold and lower than a predefined third reference read level, wherein the predefined third reference read level is higher than the predefined second reference read level.

When the reference read level is higher than the predefined second reference read level threshold, the threshold voltage of the first reference memory cell of the at least two reference memory cells may be increased.

In an embodiment of the invention, the first reference memory cell is a programmed reference memory cell.

Furthermore, the threshold voltage of the first reference memory cell of the at least two reference memory cells may be increased by applying a voltage pulse to the first reference memory cell of the at least two reference memory cells.

In an embodiment of the invention, when the reference read level is higher than the predefined third reference read level threshold, the threshold voltage of the second reference memory cell of the at least two reference memory cells is reduced.

In an embodiment of the invention, the second reference memory cell is an erased reference memory cell.

The threshold voltage of the second reference memory cell of the at least two reference memory cells may be decreased by applying a voltage pulse to the second reference memory cell of the at least two reference memory cells.

In an embodiment of the invention, the method further includes a process of determining whether the reduced threshold voltage of the second reference memory cell of the at least two reference memory cells is above a fourth reference read level threshold, and, when the reduced threshold voltage of the second reference memory cell of the at least two reference memory cells is above the minimum read level threshold, a process of further decreasing the threshold voltage of the second reference memory cell.

FIG. 6 shows a diagram 600 illustrating a method for writing at least two memory cells of an integrated circuit in accordance with one embodiment of the invention.

At 602, the threshold voltage of a first reference memory cell of the at least two reference memory cells and the threshold voltage of a second reference memory cell of the at least two reference memory cells are determined.

At 604, the threshold voltage of the first reference memory cell of the at least two reference memory cells and the threshold voltage of the second reference memory cell of the at least two reference memory cells are changed, thereby adjusting a reference read level which is dependent from at least one electrical characteristic of the at least two reference memory cells.

In an embodiment of the invention, it is further determined whether the threshold voltage of the first reference memory cell of the at least two reference memory cells is higher than a predefined first reference read level threshold and when the threshold voltage of the first reference memory cell of the at least two reference memory cells is higher than the predefined first reference read level threshold, it is determined whether the reference read level is higher than a predefined second reference read level threshold and lower than a predefined third reference read level, wherein the predefined third reference read level is higher than the predefined second reference read level. When the reference read level is higher than the predefined second reference read level threshold, the threshold voltage of the first reference memory cell of the at least two reference memory cells may be increased.

In this embodiment, the first reference memory cell may be a programmed reference memory cell.

Furthermore, the threshold voltage of the first reference memory cell of the at least two reference memory cells may be increased by applying a voltage pulse to the first reference memory cell of the at least two reference memory cells.

In an embodiment of the invention, when the reference read level is higher than the predefined third reference read level threshold, the threshold voltage of the second reference memory cell of the at least two reference memory cells may be reduced.

In this embodiment, the second reference memory cell may be an erased reference memory cell.

Furthermore, the threshold voltage of the second reference memory cell of the at least two reference memory cells may be decreased by applying a voltage pulse to the second reference memory cell of the at least two reference memory cells.

In an embodiment of the invention, the method may further include a process of determining whether the reduced threshold voltage of the second reference memory cell of the at least two reference memory cells is above a fourth read level threshold, and, when the reduced threshold voltage of the second reference memory cell of the at least two reference memory cells is above the minimum read level threshold, a process of further decreasing the threshold voltage of the second reference memory cell.

FIG. 7 shows a diagram 700 illustrating a method for writing at least two memory cells of an integrated circuit in accordance with one embodiment of the invention.

In an embodiment of the invention, the number of memory cells in a memory array (e.g., in the memory array 106) that is assigned (in other words linked) to a reference cell (or a reference cell pair), e.g., a memory array reference cell (or a memory array reference cell pair) may be defined by the number of provided sense amplifiers. A fast burst programming operation is used in accordance with an embodiment of the invention, e.g., in a code flash memory device. In an embodiment of the invention, all memory cells that are assigned to a reference cell (or a reference cell pair), e.g., a memory array reference cell (or a memory array reference cell pair) are programmed substantially at the same time (e.g., in a time window of a couple of minutes) together with the respectively assigned reference cell (or a reference cell pair), e.g., a memory array reference cell (or a memory array reference cell pair). In an embodiment of the invention, a customer (user) wants to program a 256 bit word to the memory cell array (e.g., 106). In an embodiment of the invention, the method starts upon a receiving of a write request.

In an embodiment of the invention, the default programming operation starts at 702 with a reading (determining) of the writing state of at least one reference memory cell (or a reference cell pair), e.g., a memory array reference cell (or a memory array reference cell pair), e.g., the dedicated self-synchronized reference cell (or the dedicated self-synchronized reference cell pair) versus the global reference cell (e.g., versus the main reference cells). In an embodiment of the invention, one memory bank contains 256 sense amplifiers 126 assigned to the memory cells 108 and to reference cell sense amplifiers 128.

Then, at 704, it is determined whether the at least one reference memory cell is erased. In an embodiment of the invention, this is carried out by determining the logical state of the at least one reference memory cell. By way of example, if the at least one reference memory cell has a logical state "1", it is determined that the at least one reference memory cell is erased ("Yes" in 704). This may mean that the memory cells associated with this at least one reference memory cell have not been programmed so far or have all been erased.

If it is determined in 704 that the at least one reference memory cell is erased ("Yes" in 704), all desired bits (i.e., for example all desired memory cells) according to the write request (e.g., all bits (i.e., for example all memory cells)) assigned to the at least one reference memory cell are programmed at 706 using a fast programming scheme using one or more strong programming pulses (usually having a programming voltage in the range of about 4 V to about 6 V and a pulse duration in the range of about 200 μs to about 300 μs).

Then, at 708, the at least one reference memory cell (e.g., the memory array reference cell 124 (or the memory array reference cell pair 124)) is written (e.g., programmed to a second logical value (e.g., the logical value "0").

In an embodiment of the invention, it is assumed, that a customer has been programming 64 bits in the same way as described above. In this embodiment of the invention, it is further assumed that the customer wants to further program 16 bits into the same memory cell sector into which the 64 bits have previously been programmed.

In this embodiment, after having e.g., received a write request requesting programming of 16 bits into the same memory cell sector into which the 64 bits have previously been programmed, at 702, the writing state of the dedicated reference cell (or a reference cell pair), e.g., a memory array reference cell (or a memory array reference cell pair), e.g., the dedicated self-synchronized reference cell (or the dedicated self-synchronized reference cell pair) is determined versus the global reference cell (e.g., versus the main reference cells).

In this case, it is determined in 704, that the at least one reference memory cell has already been written to (in other words, synchronized) in the past. This may be determined by determining that the at least one reference memory cell shows a logical value "0". In other words, in this case, the at least one reference memory cell is not erased ("No" in 704).

If it is determined in 704 that the at least one reference memory cell is not erased ("No" in 704), all bits (i.e., all memory cells) that are assigned to the at least one reference memory cell are read using the at least one reference memory cell as a reference memory cell providing the read level threshold for determining the respective logical state of the respective memory cells. In an embodiment of the invention, thus, 256 data bits (i.e., 256 memory cells) are read, which are assigned to the at least one reference memory cell, at 710. The logical states (e.g., the logical value) of the read memory cells are buffered at 712, e.g., in an additional memory area, e.g., in a page buffer, which may be implemented by means of a static random access memory (SRAM), which may have the same size as the number of read memory cells (e.g., the SRAM may have a size of 256 bits).

Then, at 714, the new information (e.g., the logical values of the new bits) out of the bits to be newly programmed (e.g., in accordance with the write request, 16 bits), is added to the bits that have already been programmed. In an embodiment of the invention, the new bits are written to the SRAM cells which represent memory cells in the respective sector, which memory cells have not yet been programmed by the previously written 64 bits.

At 716, the buffered data (e.g., the data stored in the SRAM) are written into the memory cell array, namely into the memory cells of the sector that has previously been read. In an embodiment of the invention, all bits to be programmed with the logical value "0" are programmed using a smart programming scheme using one or more weak or strong programming pulses (usually having a programming voltage in the range of about 3.5 V to about 5.5 V and a pulse duration in the range of about 20 μs to about 50 μs). In this embodiment, the already programmed bits (e.g., the 64 bits) and the new bits to be programmed (e.g., the 16 bits) are programmed in this manner.

Then, at 718, it is determined as to whether the programming in 716 has been successful (e.g., using a program verify process, e.g., by determining as to whether the threshold voltages of the bits programmed in 716 have the required program verify threshold voltage level).

If a bit has not been programmed correctly in 716 ("No" in 718), a fast programming scheme such as e.g., the fast programming scheme described above in 706, is carried out on the not yet correctly programmed bits in 720. Then the process continues in 718.

In case that all bits have been programmed correctly in 716 ("Yes" in 718), the at least one reference memory cell is re-adjusted to the current programming threshold value in 722.

The re-adjustment of the at least one reference memory cell (e.g., the at least one memory array reference cell (or a memory array reference cell pair) may be carried out using one of the above described programming schemes or any other suitable and as such conventional programming scheme. In an embodiment of the invention, a programming scheme is provided which will be described in more detail below. It should be mentioned that the programming scheme for adjusting at least two reference cells as described below may be used also in other programming scenarios than in the one previously described. Thus, the programming scheme for programming at least two reference cells is not limited to the write processes described herein.

Then, the write operation has been completed.

In an embodiment of the invention, if it has been determined that the at least one reference memory cell is completely erased (e.g., "Yes" in 704), all bits are programmed in accordance with a write request using a first programming scheme (e.g., using a programming (PGM) algorithm ONE). In an embodiment of the invention, the PGM algorithm ONE is a conventional standard algorithm for fast programming, wherein a default dial-in voltage (e.g., in the range of about 1200 mV) may be used. Furthermore, a large PGM voltage stepping may be provided, e.g., using voltage steps in the range of about 250 mV to about 350 mV, e.g., voltage steps of about 300 mV.

In an embodiment of the invention, if it has been determined that the at least one reference memory cell is programmed (e.g., "No" in 704), all bits of the memory cells that are assigned to the at least one reference memory cell are read and a smart programming (PGM) algorithm TWO. In an embodiment of the invention, the PGM algorithm TWO is an algorithm for slower programming than the programming according to the PGM algorithm ONE, wherein a dial-in voltage (dial-in voltage PGM algorithm ONE—x mV, wherein x may be in the range of about 500 mV to about 700 mV, e.g., about 600 mV) may be used. Furthermore, a small or weak PGM voltage stepping may be provided, e.g., using voltage steps in the range of about 100 mV to about 200 mV, e.g., voltage steps of about 150 mV, to refresh all old data bits (in other words, previously programmed data bits that have been read) to a first global program verify threshold voltage level GPV1, e.g., in the range of about 200 mV to about 600 mV lower than a predetermined threshold voltage level.

Then, in an embodiment of the invention, the new data bytes that are requested to be written in the not yet programmed memory cells which are assigned to the at least one reference memory cell are programmed using a third programming scheme (e.g., using a programming (PGM) algorithm THREE, wherein in accordance with an embodiment of the invention, the PGM algorithm THREE uses a different dial-in voltage and a different voltage stepping than in accordance with the PGM algorithm ONE and a different dial-in voltage and a different voltage stepping than in accordance with the PGM algorithm TWO, to a second global program verify threshold voltage level GPV2, which may be higher than the first global program verify threshold voltage level GPV1, e.g., by an amount in the range of about 50 mV to about 150 mV, e.g., by an amount of about 100 mV.

Then, the process may continue e.g., in 722. In an embodiment of the invention, the at least one reference memory cell is synchronized to a global read level, e.g., to a global read threshold voltage level.

In an embodiment of the invention, all bits for all sense amplifiers are always fully synchronized to one single reference memory cell (or e.g., one single reference memory cell pair), e.g., to the main reference memory cell as described above, independent from the time period between the programming of a first memory cell and the programming of a last memory cell that are assigned to the same reference memory cell, e.g., the same memory array reference cell.

In an embodiment of the invention, the already programmed memory cells are always refreshed before the new data bits or new data bytes are programmed.

An effect of one embodiment of the invention may be seen in a maximizing of the number of sense amplifiers that may be provided for one respective reference memory cell (or one respective reference memory cell pair) to increase the performance without losing the accuracy that is as such guaranteed by the used design concept.

In an embodiment of the invention, the at least one reference memory cell (e.g., the at least one memory array reference cell), e.g., the respective reference memory cell pair (e.g., the at least one memory array reference cell pair) is always correctly adjusted to the user data stored in the assigned memory cells independent from the moment in time the user data are programmed (i.e., stored) in the memory cells.

In an embodiment of the invention, all bits that are assigned to a respective reference memory cell are accessed by the sense amplifiers (e.g., 126) of the memory cells before starting to program new bits. This may be a default operation for a memory cell array (e.g., an NROM array) to guarantee a higher sense of accuracy after some years of retention of all bits programmed at different moments in time (in an example, it is assumed that 1 bit is programmed in January 2002, 7 bits are programmed in March 2003, 34 bits are programmed in May 2003, . . . , wherein in each programming operation, the processes as described above may be carried out).

The moving of read level thresholds over time will now be described in more detail with reference to FIG. 8.

FIG. 8 shows a diagram 800 illustrating threshold voltage distributions in accordance with one embodiment of the invention, wherein a first axis 802 shows the number of bits (or memory cells) versus the threshold voltages of the respective bits (or memory cells) shown along a second axis 804.

In an embodiment of the invention, at least three self-synchronized threshold voltages are set for the memory cells. In an embodiment of the invention, the following threshold voltages are set:

- a minimum read threshold voltage (Min. Read $V_{th}$) 806 (also referred to as a first self-synchronized read verify level threshold minus a second offset value N2),
- a maximum read threshold voltage (Max. Read $V_{th}$) 808 (also referred to as a second self-synchronized read verify level threshold plus a third offset value N3), and
- a minimum program threshold voltage (Min. Pgm $V_{th}$) 810 (also referred to as a self-synchronized program verify level threshold minus a first offset value N4).

Optionally, additional threshold voltages may be provided in an embodiment of the invention such as, for example, a maximum erase threshold voltage (Max. Erase $V_{th}$) 812 (also referred to as a self-synchronized erase verify level threshold minus a fourth offset value N1).

In an embodiment of the invention, these threshold voltages are set by defining the following quanities:

$$\text{Min. Pgm } V_{th} = PV - N4; \quad (1)$$

$$\text{Min. Read } V_{th} = SSRL - N2; \quad (2)$$

$$\text{Max. Read } V_{th} = SSRL + N3; \quad (3)$$

$$\text{Max. Erase } V_{th} = EV - N1; \quad (4)$$

wherein

EV denotes a predefined erase threshold voltage level 814;

PV denotes a predefined programming threshold voltage level 816;

SSRL denotes a self-synchronized read level threshold voltage level 818 which will be described in more detail below;

N4 denotes a predefined first offset value which may be e.g., in the range of about 150 mV to 500 mV, e.g., in the range of about 250 mV to 400 mV, e.g., in the range of about 300 mV to 350 mV;

N2 denotes a predefined second offset value which may be e.g., in the range of about 250 mV to 600 mV, e.g., in the range of about 350 mV to 500 mV, e.g., in the range of about 400 mV to 450 mV;

N3 denotes a predefined third offset value which may be e.g., in the range of about 80 mV to 300 mV, e.g., in the range of about 100 mV to 250 mV, e.g., in the range of about 150 mV to 200 mV; and N1 denotes a predefined fourth offset value which may be e.g., in the range of about 120 mV to 350 mV, e.g., in the range of about 150 mV to 300 mV, e.g., in the range of about 200 mV to 250 mV.

In an embodiment of the invention, the minimum read threshold voltage (Min. Read $V_{th}$) 806 may be defined as a predefined offset (e.g., the second offset value N2) below the self-synchronized read level threshold voltage (SSRL) 818; the maximum read threshold voltage (Max. Read $V_{th}$) 808 may be defined as a predefined offset (e.g., the third offset value N3) above the self-synchronized read level threshold voltage (SSRL) 818; the minimum program threshold voltage (Min. Pgm $V_{th}$) 810 may be defined as a predefined offset (e.g., the first offset value N4) below the predefined programming threshold voltage level (PV) 816; the maximum erase threshold voltage (Max. Erase $V_{th}$) 812 may be defined as a predefined offset (e.g., the fourth offset value N1) below the predefined erase threshold voltage level (EV) 814.

FIG. 8 further shows threshold voltage distributions 820, 822 of erased reference memory cells of, e.g., reference memory cell pairs and threshold voltage distributions 824, 826 of programmed reference memory cells of, e.g., reference memory cell pairs, e.g., of memory array reference memory cell pairs. As is shown in FIG. 8, the threshold voltage of the erased reference memory cell as well as the threshold voltage of the programmed reference memory cell of a respective reference memory cell pair (e.g., of a respective memory array reference memory cell pair) may be adjusted by means of respective programming/erase pulses being applied to a respective reference memory cell (e.g., a memory array reference cell).

In the following, a method for programming (in other words, e.g., re-adjusting) reference memory cells (e.g., for implementing process 722 described above) will be described in detail, which takes into account four additional levels, the threshold voltage of a reference cell may be checked against.

FIG. 9 shows a diagram 900 illustrating a method for re-adjusting a reference memory cell of an integrated circuit in accordance with one embodiment of the invention.

In an embodiment of the invention, in accordance with the method, at 902, the threshold voltage of the programmed reference memory cell of a reference memory cell pair is determined. Then, at 904, it is determined as to whether the programmed reference cell of a reference cell pair passes (e.g., has a higher threshold voltage than) the minimum program threshold voltage (Min. Pgm $V_{th}$) 810. That is, whether the threshold voltage of the reference memory cell is greater than the minimum program threshold voltage (Min. Pgm $V_{th}$) 810.

If this is not the case ("No" in 904), one or more additional programming pulses are applied to the programmed reference memory cell of the reference memory cell pair in 906. Then, the process continues in 904.

However, if the programmed reference cell of a reference cell pair passes (e.g., has a higher threshold voltage than) the minimum program threshold voltage (Min. Pgm $V_{th}$) 810 ("Yes" in 904), the target reference cell level (also referred to as the reference read level) which may be dependent from at least one electrical characteristic of the at least two reference memory cells, e.g., dependent from the threshold voltage of the two reference cells of a respective reference cell pair, is checked against the minimum read threshold voltage (Min. Read $V_{th}$) 806. In other words, it is determined at 908, whether the reference read level of the current reference memory cell pair is higher than the minimum read threshold voltage (Min. Read $V_{th}$) 806. In an embodiment of the invention, the reference read level may be half of the sum of the absolute values of the threshold voltages of the two reference cells of a respective reference cell pair. In an embodiment of the invention, the reference read level corresponds to the self-synchronized read level threshold voltage level 818 described above.

If it is determined at 908 that the reference read level of the current reference memory cell pair is not higher than the minimum read threshold voltage (Min. Read $V_{th}$) 806 ("No" in 908), at 910, one or more additional programming pulses (e.g., a short programming pulse having a pulse duration in the range of about 20 µs to about 50 µs) are applied to the programmed reference memory cell. The process then continues in 908.

If it is determined at 908 that the reference read level of the current reference memory cell pair is higher than the minimum read threshold voltage (Min. Read $V_{th}$) 806 ("Yes" in 908), at 912, it is further determined whether the reference read level of the current reference memory cell pair is equal to or lower than the maximum read threshold voltage (Max. Read $V_{th}$) 808. Furthermore, optionally, one or more additional programming pulses may be provided to the programmed reference memory cell.

If it is determined at 912 that the reference read level of the current reference memory cell pair is equal to or lower than the maximum read threshold voltage (Max. Read $V_{th}$) 808 ("Yes" in 912), at 914, the process is ended.

If it is determined at 912 that the reference read level of the current reference memory cell pair is higher than the maximum read threshold voltage (Max. Read $V_{th}$) 808 ("No" in 912), at 916, one or more erase pulses are applied to the corresponding erased reference memory cell of the reference memory cell pair, thereby further reducing the threshold voltage of the erased reference memory cell.

Then, at 918, it may be determined whether the (re-)adjusted threshold voltage of the erased reference memory cell is still below the maximum erase threshold voltage (Max. Erase $V_{th}$) 812.

If the (re-)adjusted threshold voltage of the erased reference memory cell is still below the maximum erase threshold voltage (Max. Erase $V_{th}$) 812 ("Yes" in 918), the process may continue in 916.

If the (re-)adjusted threshold voltage of the erased reference memory cell is still below the maximum erase threshold voltage (Max. Erase $V_{th}$) 812 ("No" in 918), the process may continue in 908.

In an embodiment of the invention as described above, the reference memory cells are brought into the right position (e.g., having the right threshold voltage) using three or four additional levels, e.g., the above described three or four additional levels Min. Pgm $V_{th}$, Min. Read $V_{th}$, Max. Read $V_{th}$, Max. Erase $V_{th}$. Thus, in an embodiment of the invention, a good tradeoff is achieved between a fast programming of memory array bits (e.g., the memory cells) using for example a one programming pulse strategy or a two programming pulse strategy versus slow and accurate programming of one or two corresponding reference cell bits (e.g., the one or two corresponding reference memory cells).

In an alternative embodiment of the invention, the one or more reference memory cells may be multi-bit or multi-level reference memory cells. In this way, each (e.g., both) programmable "bit(s)" of the respective reference memory cell may be used to change the reference read level of the current reference memory cell pair, thereby, e.g., using the so called second bit effect.

An embodiment of programming a reference memory cell will be described in more detail below.

In an embodiment of the invention, the left bit of the multi-bit reference memory cell (in general, a first bit of the multi-bit reference memory cell) is programmed to a reference voltage level that is higher than the minimum program threshold voltage (Min. Pgm $V_{th}$) 810.

Then, in this embodiment, it is checked if the target level of the reference voltage level is higher than the minimum read threshold voltage (Min. Read $V_{th}$) 806. If the target level of the reference voltage level is higher than the minimum read threshold voltage (Min. Read $V_{th}$) 806, an additional smart programming pulse is applied to the reference memory cell and the check process is repeated. If the last programming pulse appears to have been too strong and the target level of the reference voltage level is higher than the maximum read threshold voltage (Max. Read $V_{th}$) 808 a smart PAE (Program After Erase) pulse is applied to the erased reference memory cell of the reference memory cell pair (alternatively, e.g., to the right bit (e.g., the other bit) of one multi-bit reference memory cell) and it is checked if the reference voltage level is still below the erase threshold voltage level 814.

Then, in an embodiment of the invention, in which the reference memory cell is a multi-bit reference memory cell, the left bit is refreshed, e.g., in the following manner.

In an embodiment of the invention, it is checked if the left bit is below the minimum program threshold voltage (Min. Pgm $V_{th}$) 810, and, if this is the case, a smart programming pulse is applied to the left bit of the reference memory cell and it is checked again whether the left bit is below the minimum program threshold voltage (Min. Pgm $V_{th}$) 810. This is repeated until the left bit is no longer below the minimum program threshold voltage (Min. Pgm $V_{th}$) 810.

Then, it is checked whether the target level of the reference voltage level is between the minimum read threshold voltage (Min. Read $V_{th}$) 806 and the maximum read threshold voltage (Max. Read $V_{th}$) 808. If this is not the case, appropriate programming pulses are applied to the left bit or the right bit of the reference memory cell until the above criterion is fulfilled.

Figure 10A:
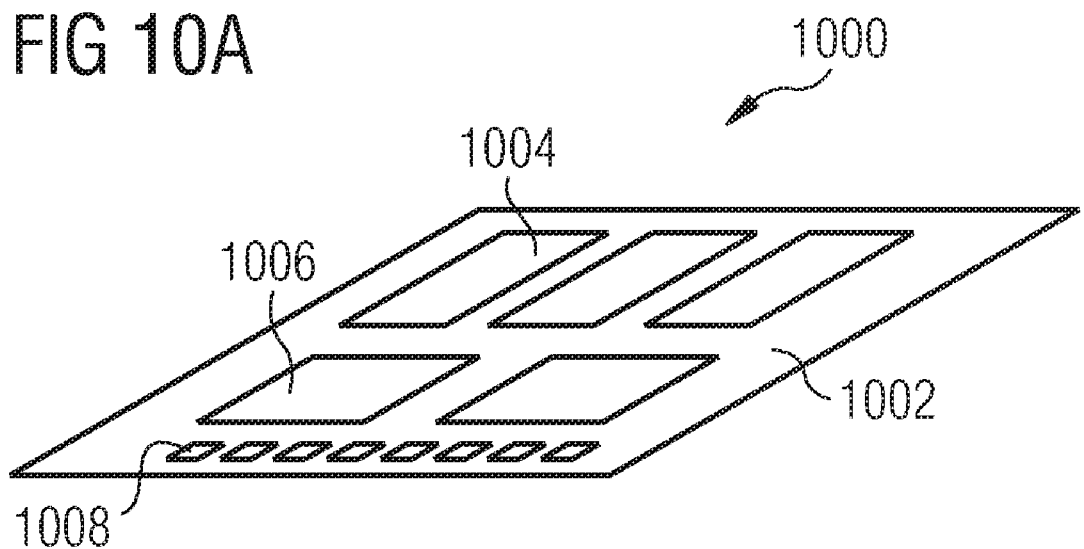
FIGS. 10A and 10B show a memory module (FIG. 10A) and a stackable memory module (FIG. 10B) in accordance with an embodiment of the invention.
Figure 10B:
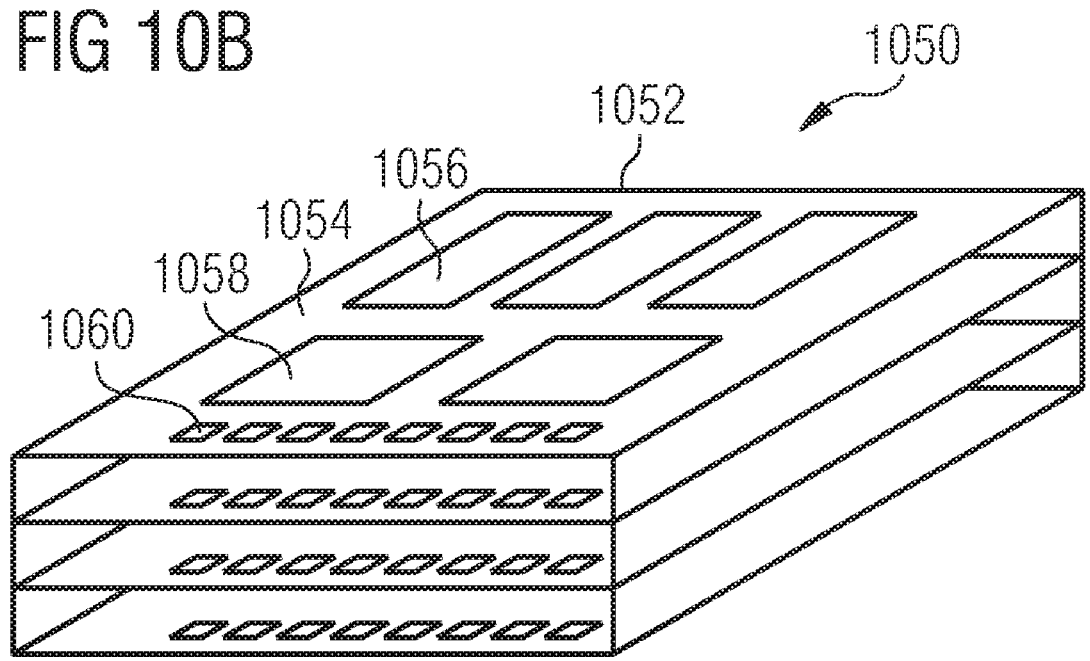

As shown in FIGS. 10A and 10B, in some embodiments, memory devices such as those described herein may be used in modules.

In FIG. 10A, a memory module 1000 is shown, on which one or more memory devices 1004 are arranged on a substrate 1002. The memory device 1004 may include numerous memory cells, each of which uses a memory element in accordance with an embodiment of the invention. The memory module 1000 may also include one or more electronic devices 1006, which may include memory, processing circuitry, control circuitry, addressing circuitry, bus interconnection circuitry, or other circuitry or electronic devices that may be combined on a module with a memory device, such as the memory device 1004. Additionally, the memory module 1000 includes multiple electrical connections 1008, which may be used to connect the memory module 1000 to other electronic components, including other modules.

As shown in FIG. 10B, in some embodiments, these modules may be stackable, to form a stack 1050. For example, a stackable memory module 1052 may contain one or more memory devices 1056, arranged on a stackable substrate 1054. The memory device 1056 contains memory cells that employ memory elements in accordance with an embodiment of the invention. The stackable memory module 1052 may also include one or more electronic devices 1058, which may include memory, processing circuitry, control circuitry, addressing circuitry, bus interconnection circuitry, or other circuitry or electronic devices that may be combined on a module with a memory device, such as the memory device 1056. Electrical connections 1060 are used to connect the stackable memory module 1052 with other modules in the stack 1050, or with other electronic devices. Other modules in the stack 1050 may include additional stackable memory modules, similar to the stackable memory module 1052 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of operating an integrated circuit having at least one memory cell and at least two reference memory cells, the method comprising:
    writing the at least two reference memory cells to a given writing state, thereby setting a reference read level dependent from at least one electrical characteristic of the at least two reference memory cells, wherein writing the at least two reference memory cells comprises:
        determining whether the reference read level of the at least two reference memory cells is within a predefined reference read level margin; and
        depending on whether the reference read level is within the predetermined reference read level margin, applying at least one write pulse to at least one reference memory cell of the at least two reference memory cells;
determining the writing state of the at least one reference memory cell;
depending on the writing state of the at least one reference memory cell, writing the at least one memory cell.

2. The method of claim 1, wherein at least one of the at least two reference memory cells is assigned to the at least one memory cell.

3. The method of claim 1, wherein when the writing state of a first reference memory cell of the at least two reference memory cells is a first writing state, the first reference memory cell is written using a first memory cell writing scheme; and
wherein when the writing state of a second reference memory cell of the at least two reference memory cells is a second writing state, the second reference memory cell is written using a second memory cell writing scheme.

4. The method of claim 3, wherein the first writing state indicates that the first reference memory cell is erased; and
wherein the second writing state indicates that the second reference memory cell has already been programmed or re-programmed.

5. The method of claim 4, wherein the first memory cell writing scheme includes applying at least one writing pulse having a higher voltage to the at least one reference memory cell than at least one programming pulse provided in the second memory cell programming scheme or having a longer duration than the at least one programming pulse provided in the second memory cell programming scheme.

6. The method of claim 1, wherein the writing state of the at least one reference memory cell is determined by comparing at least one electrical characteristic of the at least one reference memory cell with at least one electrical reference characteristic of at least one global reference memory cell which is assigned to a plurality of reference memory cells.

7. The method of claim 1, further comprising:
receiving a write request to write the at least one memory cell; and
upon receiving the write request, determining the writing state of the at least one reference memory cell.

8. The method of claim 1, wherein writing the at least two reference memory cells further comprises:
determining whether the threshold voltage of a first reference memory cell of the at least two reference memory cells is higher than a predefined first reference read level threshold; and
if the threshold voltage of the first reference memory cell of the at least two reference memory cells is higher than the predefined first reference read level threshold, determining whether the reference read level is higher than a predefined second reference read level threshold and lower than a predefined third reference read level, wherein the predefined third reference read level is higher than the predefined second reference read level.

9. The method of claim 8, further comprising: if the reference read level is higher than the predefined second reference read level threshold, increasing the threshold voltage of the first reference memory cell of the at least two reference memory cells.

10. The method of claim 9, wherein the first reference memory cell is a programmed reference memory cell.

11. The method of claim 8, further comprising: if the reference read level is higher than the predefined third reference read level threshold, reducing the threshold voltage of the second reference memory cell of the at least two reference memory cells.

12. The method of claim 11, wherein the second reference memory cell is an erased reference memory cell.

13. The method of claim 11, further comprising:
determining whether the reduced threshold voltage of the second reference memory cell of the at least two reference memory cells is above a fourth read level threshold; and
if the reduced threshold voltage of the second reference memory cell of the at least two reference memory cells is above the fourth reference read level threshold, further decreasing the threshold voltage of the second reference memory cell.

14. The integrated circuit of claim 1, wherein at least one of the at least two reference memory cells is assigned to the at least one memory cell.

15. The integrated circuit of claim 1, wherein the write circuit is configured:
if the writing state of at least one of the at least two reference memory cells is a first writing state, to write the at least one reference memory cell using a first memory cell writing scheme; and
if that the writing state of the at least one reference memory cell is a second writing state, to write the at least one reference memory cell using a second memory cell writing scheme.

16. The integrated circuit of claim 15, wherein the first writing state indicates that the at least one reference memory cell is erased; and
wherein the second writing state indicates that the at least one reference memory cell has already been programmed or re-programmed.

17. The integrated circuit of claim 15, wherein the first memory cell writing scheme includes applying at least one writing pulse having a higher voltage to the at least one memory cell than at least one programming pulse provided in the second memory cell programming scheme or having a longer duration than the at least one programming pulse provided in the second memory cell programming scheme.

18. A method of operating an integrated circuit having at least two memory cells, the method comprising:
determining a threshold voltage of a first reference memory cell of the at least two reference memory cells and a threshold voltage of a second reference memory cell of the at least two reference memory cells; and changing the threshold voltage of the first reference memory cell of the at least two reference memory cells and the threshold voltage of the second reference memory cell of the at least two reference memory cells, thereby adjusting a reference read level which is dependent from at least one electrical characteristic of the at least two reference memory cells; and
determining whether the threshold voltage of a first reference memory cell of the at least two reference memory cells is higher than a predefined first reference read level threshold; and if the threshold voltage of the first reference memory cell of the at least two reference memory cells is higher than the predefined first reference read level threshold, determining whether the reference read level is higher than a predefined second reference read level threshold and lower than a predefined third reference read level threshold, wherein the predefined third reference read level threshold is higher than the predefined second reference read level threshold.

19. The method of claim 18, further comprising: if the reference read level is higher than the predefined second reference read level threshold, increasing the threshold voltage of the first reference memory cell of the at least two reference memory cells.

20. The method of claim 19, wherein the first reference memory cell is a programmed reference memory cell.

21. The method of claim 18, further comprising: if the reference read level is higher than the predefined third reference read level threshold, reducing the threshold voltage of the second reference memory cell of the at least two reference memory cells.

22. The method of claim 21, wherein the second reference memory cell is an erased reference memory cell.

23. The method of claim 21, further comprising: determining whether the reduced threshold voltage of the second reference memory cell of the at least two reference memory cells is above a predefined fourth reference read level threshold; and if the reduced threshold voltage of the second reference memory cell of the at least two reference memory cells is above the fourth reference read level threshold, further decreasing the threshold voltage of the second reference memory cell.

24. The method of claim 23, wherein the predefined fourth reference read level threshold is a self-synchronized erase verify level threshold.

25. The method of claim 24, wherein the predefined fourth reference read level threshold is the self-synchronized erase verify level threshold minus a fourth offset value.

26. The method of claim 18, wherein the predefined first reference read level threshold is a self-synchronized program verify level threshold.

27. The method of claim 26, wherein the predefined first reference read level threshold is the self-synchronized program verify level threshold minus a first offset value.

28. The method of claim 18, wherein the predefined second reference read level threshold is a first self-synchronized read verify level threshold.

29. The method of claim 28, wherein the predefined second reference read level threshold is the first self-synchronized read verify level threshold minus a second offset value.

30. The method of claim 18, wherein the predefined third reference read level threshold is a second self-synchronized read verify level threshold.

31. The method of claim 30, wherein the predefined third reference read level threshold is the second self-synchronized read verify level threshold plus a third offset value.

32. An integrated circuit, comprising:
at least one memory cell;
at least two reference memory cells;
a determination circuit configured to determine whether a reference read level of the at least two reference memory cells is within a predefined reference read level margin, wherein the reference read level is dependent from at least one electrical characteristic of the at least two reference memory cells; and
a write circuit configured to:
depending on whether the reference read level is within the predetermined reference read level margin, apply at least one write pulse to at least one reference memory cell of the at least two reference memory cells; and
depending on the writing state of the at least one reference memory cell, apply at least one write pulse to the at least one memory cell.

33. The integrated circuit of claim 32, wherein the determination circuit is configured to determine the writing state of at least one of the at least two reference memory cells by comparing at least one electrical characteristic of the at least one reference memory cell with at least one electrical reference characteristic of at least one global reference memory cell which is assigned to a plurality of reference memory cells.

34. The integrated circuit of claim 32, wherein the determination circuit is configured:
to determine whether a threshold voltage of a first reference memory cell of the at least two reference memory cells is higher than a predefined first reference read level threshold; and
if the threshold voltage of the first reference memory cell of the at least two reference memory cells is higher than the predefined first reference read level threshold, to determine whether the reference read level is higher than a predefined second reference read level threshold and lower than a predefined third reference read Level threshold, wherein the predefined third reference read level threshold is higher than the predefined second reference read level threshold.

35. The integrated circuit of claim 34, wherein the write circuit is configured, if the reference read level is higher than the predefined second reference read level threshold, to increase the threshold voltage of the first reference memory cell of the at least two reference memory cells.

36. The integrated circuit of claim 35, wherein the first reference memory cell is a programmed reference memory cell.

37. The integrated circuit of claim 34, wherein the write circuit is configured, if the reference read level is higher than the predefined third reference read level threshold, to reduce the threshold voltage of the second reference memory cell of the at least two reference memory cells.

38. The integrated circuit of claim 37, wherein the second reference memory cell is an erased reference memory cell.

39. The integrated circuit of claim 38, wherein the determination circuit is configured to determine whether the reduced threshold voltage of the second reference memory cell of the at least two reference memory cells is above a predefined fourth reference read level threshold; and
wherein the write circuit is configured, when the reduced threshold voltage of the second reference memory cell of the at least two reference memory cells is above the predefined fourth reference read level threshold, to further decrease the threshold voltage of the second reference memory cell.

40. The integrated circuit of claim 32, further comprising a plurality of memory cells being connected with one common control line, wherein the at least one reference memory cell is assigned to the plurality of memory cells.

41. The integrated circuit of claim 40, wherein the common control line is a word line.

42. The integrated circuit of claim 32, further comprising a plurality of sense amplifiers, wherein at least one sense amplifier is provided for the at least one memory cell, and wherein at least one sense amplifier is provided for the at least one reference memory cell.

43. An integrated circuit, comprising:
at least two reference memory cells;
a determination circuit configured to determine:
a threshold voltage of a first reference memory cell of the at least two reference memory cells and a threshold voltage of a second reference memory cell of the at least two reference memory cells;
whether the threshold voltage of the first reference memory cell of the at least two reference memory cells is higher than a predefined first reference read level threshold; and if the threshold voltage of the first reference memory cell of the at least two reference memory cells is higher than the predefined first reference read level threshold, to determine whether the reference read level is higher than a predefined second reference read level threshold and lower than a predefined third reference read level, wherein the predefined third reference read level is higher than the predefined second reference read level; and a reference read level adjusting circuit configured to change the threshold voltage of the first reference memory cell of the at least two reference memory cells and the threshold voltage of the second reference memory cell of the at least two reference memory cells, thereby adjusting a reference read level which is dependent from at least one electrical characteristic of the at least two reference memory cells.

44. The integrated circuit of claim 43, wherein the reference read level adjusting circuit is configured, when the reference read level is higher than the predefined second reference read level threshold, to increase the threshold voltage of the first reference memory cell of the at least two reference memory cells.

45. The integrated circuit of claim 44, wherein the first reference memory cell is a programmed reference memory cell.

46. The integrated circuit of claim 43, wherein the reference read level adjusting circuit is configured, when the reference read level is higher than the predefined third reference read level threshold, to reduce the threshold voltage of the second reference memory cell of the at least two reference memory cells.

47. The integrated circuit of claim 46, wherein the second reference memory cell is an erased reference memory cell.

48. The integrated circuit of claim 47, wherein the determination circuit is configured: to determine whether the reduced threshold voltage of the second reference memory cell of the at least two reference memory cells is above a predefined fourth reference read level threshold; and when the reduced threshold voltage of the second reference memory cell of the at least two reference memory cells is above the fourth reference read level threshold, to further decrease the threshold voltage of the second reference memory cell.

* * * * *